(12) United States Patent
Yokoyama et al.

(10) Patent No.: US 7,451,656 B2
(45) Date of Patent: Nov. 18, 2008

(54) SEMICONDUCTOR DEVICE EMBEDDED WITH PRESSURE SENSOR AND MANUFACTURING METHOD THEREOF

(75) Inventors: Natsuki Yokoyama, Mitaka (JP); Shuntaro Machida, Kokubunji (JP); Yasushi Goto, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/878,243

(22) Filed: Jul. 23, 2007

(65) Prior Publication Data

US 2007/0262401 A1     Nov. 15, 2007

Related U.S. Application Data

(63) Continuation of application No. 11/237,897, filed on Sep. 29, 2005, now Pat. No. 7,270,012.

(30) Foreign Application Priority Data

Oct. 1, 2004   (JP)   ............... 2004-289476
Sep. 29, 2005  (JP)   ............... 2005-284013

(51) Int. Cl.
    *G01L 9/00*    (2006.01)
    *G01L 9/16*    (2006.01)

(52) U.S. Cl. .......................... 73/754; 73/715

(58) Field of Classification Search ............ 73/700–756
    See application file for complete search history.

(56) References Cited

U.S. PATENT DOCUMENTS 3,922,705 A    11/1975   Yerman (Continued)

FOREIGN PATENT DOCUMENTS

| JP | 9-17276 | 6/1995 |
|---|---|---|
| JP | 2000-299016 | 4/1999 |
| JP | 2001215208 A | * 8/2001 |
| JP | 2005045112 A | * 2/2005 |

OTHER PUBLICATIONS

J. Dancaster et al., "Two-Chip Pressure Sensor and Signal Conditioning", 2003 IEEE, the 12th International Conference on Solid State Sensors, Actuators and Microsystems (Jun. 8-12, 2003), pp. 1699-1702.

(Continued)

*Primary Examiner*—Andre J Allen
*Assistant Examiner*—Jermaine Jenkins
(74) *Attorney, Agent, or Firm*—Reed Smith LLP; Stanley P. Fisher, Esq.; Juan Carlos A. Marquez, Esq.

(57) ABSTRACT

The method for promoting the size reduction, the performance improvement and the reliability improvement of a semiconductor device embedded with pressure sensor is provided. In a semiconductor device embedded with pressure sensor, a part of an uppermost wiring is used as a lower electrode of a pressure detecting unit. A part of a silicon oxide film formed on the lower electrode is a cavity. On a tungsten silicide film formed on the silicon oxide film, a silicon nitride film is formed. The silicon nitride film has a function to fill a hole or holes and suppress immersion of moisture from outside to the semiconductor device embedded with pressure sensor. A laminated film of the silicon nitride film and the tungsten silicide film forms a diaphragm of the pressure sensor.

9 Claims, 37 Drawing Sheets

U.S. PATENT DOCUMENTS

| | | |
|---|---|---|
| 4,158,807 A | 6/1979 | Stenuria |
| 4,260,224 A * | 4/1981 | Takayama .................... 349/83 |
| 4,823,605 A | 4/1989 | Stein |
| 4,908,693 A | 3/1990 | Nishiguchi |
| 5,101,665 A | 4/1992 | Mizuno |
| 5,391,502 A | 2/1995 | Wei |
| 5,596,219 A | 1/1997 | Hierold |
| 6,207,467 B1 | 3/2001 | Vaiyapuri et al. |
| 6,313,729 B1 | 11/2001 | Winterer et al. |
| 6,472,243 B2 | 10/2002 | Gogoi et al. |
| 6,558,577 B1 | 5/2003 | Niihara et al. |
| 6,640,642 B1 * | 11/2003 | Onose et al. .................. 73/718 |
| 6,791,134 B2 * | 9/2004 | Kimura et al. .............. 257/296 |

OTHER PUBLICATIONS

Abhijeet V. Chavan et al., "A Monolithic Fully-Integrated Vacuum-Sealed CMOS Pressure Sensor", IEEE Transactions on Electron Devices, vol. 49, No. 1, Jan. 2002, pp. 164-169.

Klaus Kasten et al., "CMOS-Compatible Capacitive High Temperature Pressure Sensors", 2000 Elsevier Science S.A., pp. 147-152.

Klaus Kasten et al., "High Temperature Pressure Sensor with Monolithically Integrated CMOS Readout Circuit Based on SIMOX Technology", The 11$^{th}$ International Conference on Solid State Sensors and Actuators (Jun. 10-14, 2001), 4 pages.

T. Bevar, "Solutions for Tire Pressure Monitoring Systems", pp. 261-269.

* cited by examiner

SEMICONDUCTOR DEVICE EMBEDDED WITH PRESSURE SENSOR AND MANUFACTURING METHOD THEREOF

CROSS-REFERENCE RELATED APPLICATION

This application is a Continuation of nonprovisional U.S. application Ser. No. 11/237,897 filed on Sep. 29, 2005 now U.S. Pat. No. 7,270,012. Priority is claimed based on U.S. application Ser. No. 11/237,897 filed on Sep. 29, 2005, which claims priority from Japanese Patent Applications 2004-289476 filed on Oct. 1, 2004 and 2005-284013 filed on Sep. 29, 2005, the contents of which are hereby incorporated by reference into this application.

TECHNICAL FIELD OF THE INVENTION

The present invention relates to a semiconductor device embedded with pressure sensor and a manufacturing method thereof. More particularly, the present invention relates to a technology effectively applied to the size reduction of a semiconductor device embedded with pressure sensor and the performance enhancement thereof.

BACKGROUND OF THE INVENTION

Pressure sensors are sensors used in various fields. Of these, the demands for a small-sized pressure sensor formed by using MEMS (Micro Electro Mechanical Systems) manufacturing technologies or semiconductor microfabrication technologies have been increasing rapidly. For example, for industrial use, such sensors have been applied to pressure control and monitoring of various types of plant equipment. For consumer use, they have been used for gas meters, flowmeters, sphygmomanometers, and others. For automobile, they have been used for engine or brake control, tire pressure monitoring, and others.

In view of means for detecting pressure, the small-sized pressure sensors can be classified into those of a piezoresistance type that use a piezoresistive element embedded in a diaphragm to detect a deflection of the diaphragm caused by pressure, those of a capacitance type that detect a distance between two electrodes varying by pressure as a change in capacitance, those of a resonator type that detect a change in resonance frequency of a resonator caused by a change in pressure, and others.

On the other hand, as pressure sensors directed to the purposes other than those of the small-sized pressure sensors mentioned above, pressure-sensitive sensors have also been increasingly developed. Such a sensor is mounted on the head or leg portion of a pet robot, for example, for use in detecting a contact with a human. The sensor is sometimes used at the input unit of an input device for adjusting the rotation speed of a motor or the sound volume of a speaker. The pressure-sensitive sensor detects a pressure by means of a pressure-sensitive conductive film, for example. The value of the resistance of the pressure-sensitive conductive film varying in accordance with a deformation by pressure is detected.

Note that one example of the pressure-sensitive sensor using a pressure-sensitive conductive film is disclosed in Japanese Patent Laid-Open Publication No. 9-17276 (Patent Document 1). Also, one example of the pressure-sensitive conductive film and the manufacturing method thereof are disclosed in Japanese Patent Laid-Open Publication No. 2000-299016 (Patent Document 2).

Particularly in a small-sized pressure sensor for automobiles, demands for size reduction, performance enhancement, and cost reduction are generally strong. Especially, the reduction in size and weight is particularly important for a pressure detecting unit used in a tire pressure monitoring system (TPMS), due to its characteristics of being installed in a tire for a long time. Also, since power is often fed through a button battery, low power consumption is also desired. In the initial stage of the practical use of the sensors, a method in which components including a piezoresistive monolithic pressure sensor, a semiconductor device for signal processing, a wireless semiconductor device, a button battery and others are mounted on a small-sized printed board was used. However, due to problems such as high cost and large power consumption leading to a short battery life, such a method has not yet been widespread.

For the achievement of size reduction, low power consumption and low cost, it is effective to accommodate, in addition to the monolithic pressure sensor, peripheral semiconductor devices required for processing and transmitting a signal from the sensor in a single package, and further, in a single chip. This has been actively studied.

The single-packaging has been achieved by mounting a piezoresistive pressure sensor or the like and a semiconductor device having a function to amplify a signal from the sensor and other functions in a single package by using a mounting technology. An example of such single-packaging is disclosed in J. Dancaster et al., "TWO-CHIP PRESSURE SENSOR AND SIGNAL CONDITIONING", TRANSDUCERS '03 (The 12th International Conference on Solid State Sensors, Actuators and Microsystems, Boston, Jun. 9-12 2003) proceedings, pp. 1669-1702 (Non-patent Document 1). Since this single-packaging allows the pressure sensor and the semiconductor device to be manufactured separately, each device structure and manufacturing process does not have to be changed, which is advantageous. However, since the pressure sensor and a part of the semiconductor devices are simply packaged as one, it is difficult to achieve the cost reduction. Although a piezoresistive pressure sensor from which a large output signal can be obtained is often used, such a piezoresistive pressure sensor requires large power consumption. In the non-patent document 1, effects of low power consumption achieved through the contrivance on the circuitry are described. However, effects of low power consumption achieved by the single-packaging itself is considered to be small.

On the other hand, the single-chip has been achieved by a manufacturing method in which two substrates are bonded together. A recent example of such a method is described in detail in Abhijeet V. Chavan et al., "A Monolithic Fully-Integrated Vacuum-sealed CMOS Pressure SENSOR", IEEE TRANSACTIONS ON ELECTRON DEVICES, VOL. 49, NO. 1, JANUARY 2002, pp. 164-169 (Non-patent Document 2). In this method, a substrate on which at least a part of a pressure sensor is formed and a substrate on which a semiconductor device or the like is formed are bonded together by means of anodic bonding or the like to form one substrate. Another exemplary method is a manufacturing method in which, after a semiconductor device is formed on the perimeter of a semiconductor chip, the rear surface at the center portion of the chip is processed into a thin film by the etching using potassium hydroxide to form a diaphragm, and a glass substrate is laminated on the rear surface side to form a vacuum cavity portion. In either case, for saving the manufacturing effort and reducing the cost, a method of bonding during a substrate stage before dicing is generally taken. Thereafter, by dicing the bonded substrates, a pressure sensor and a semiconductor device are embedded in one chip. What is used in the Non-patent Document 2 is a capacitive pressure sensor. Since the single-chip made by this method can shorten the wiring length between the pressure sensor and the detecting circuit, a capacitive sensor required to detect a minute change in capacitance can be applied. However, similar to the above-described single-packaging, the single-chip made by this method has a limitation on the cost reduction.

A method having a higher possibility for suppressing manufacturing cost and achieving further size reduction and low power consumption than that of the above-described single-packaging or single-chip made by bonding substrates is a method of forming both of a pressure sensor and a semiconductor device together on a semiconductor substrate, with a contrivance on device structure and manufacturing process. Depending on the combination of the type of the pressure sensor and the semiconductor device for realizing a single-chip, some contrivance will be required for the device structure and the manufacturing process. Methods of forming a capacitive pressure sensor while manufacturing a semiconductor device are disclosed in U.S. Pat. No. 6,472,243 (Patent Document 3), Klaus Kasten et al., "CMOS-compatible capacitive high temperature pressure sensors", Sensors and Actuators 85 (2000), pp. 147-152 (Non-patent Document 3), and Klaus Kasten et al., "High temperature pressure sensor with monolithically integrated CMOS readout circuit based on SIMOX technology", The 11th International Conference on Solid-State Sensors and Actuators (Munich, Germany, Jun. 10-14, 2001) proceedings, pp. 510-513 (Non-patent Document 4). With these manufacturing methods, some products in which CMOS (Complementary Metal Oxide Semiconductors) including analog/digital combined circuits such as a temperature sensor for temperature compensation, an analog-digital converter circuit, a logic circuit, a clock and a power supply control circuit are combined in addition to the pressure sensor in one chip have already been in practical use. In some cases, non-volatile memory such as EEPROM (Electrically Erasable and Programmable Read Only Memory) for storing calibration data or the like may be also embedded.

In the conventional technologies described in Patent Document 3 and U.S. Pat. No. 5,596,219 (Patent Document 4), Non-patent Document 3 and 4, and T. Bever et al., "Solutions for The Pressure Monitoring Systems", 7th International Conference on Advanced Microsystems for Automotive Applications 2003 (Berlin, Germany, May 22-23, 2003) proceedings, pp. 261-269 (Non-patent Document 5), a polycrystalline silicon layer is used as a diaphragm serving as an upper electrode of a capacitor for obtaining a capacitance in accordance with the pressure. As a lower electrode, another polycrystalline silicon layer different from a diaphragm formed on a diffusion layer in the substrate or a field oxide film is used.

The reason why the conventional technologies select the above structure is to form a capacitor having a shape close to that of a parallel plate capacitor. To ensure durability of the diaphragm and approximate a capacitor with its capacitance varying linearly with respect to pressure, a parallel plate capacitor is considered to be most advantageous.

In general, in the course of manufacturing a semiconductor device, the topography gets less planar. In some cases, a planarization process may be inserted to achieve more planar topography. However, in a general method of manufacturing a semiconductor device particularly with its critical dimension larger than 0.5 μm, even if local nonplanar topography are mitigated, nonplanar topography in a large area such as that required by a capacitor are not resolved. That is, it is extremely difficult to form a parallel plate capacitor on an upper portion where a semiconductor element such as a transistor has been once formed. When a pressure sensor is embedded together with the semiconductor device produced by such a manufacturing method, there is no other way but to secure a flat area on the diffusion layer or the field oxide film and then form a capacitor for detecting pressure thereon.

One reason for using a polycrystalline silicon layer as the electrode material is that the electrode can be formed simultaneously during the process of forming a polycrystalline silicon layer serving as a gate electrode or a resistive layer of a transistor. Also, since it is resistant to hydrofluoric acid, polycrystalline silicon can be used as a mask when a silicon oxide layer between electrodes of the capacitor is etched, thereby advantageously making it easy to form the capacitor. Furthermore, since polycrystalline silicon has been studied for a long time as a material for movable parts of MEMS, which film to be used for forming an excellent diaphragm has been greatly elucidated. Also at this point, polycrystalline silicon can be considered as an easy-to-use material.

SUMMARY OF THE INVENTION

The capacitive pressure sensor of the semiconductor device embedded with pressure sensor disclosed in Patent Document 3 and Non-patent Documents 3 to 5 is more suitable for being embedded onto the same substrate as that of the semiconductor device when compared with sensors of a piezoresistance type or an oscillator type. Even so, there are many manufacturing limitations. The largest problem is that the reduction of a chip area of the semiconductor device embedded with pressure sensor is difficult.

In the semiconductor device embedded with pressure sensor disclosed in Patent Document 3 and Non-patent Documents 3 to 5, because of the above-described structure, the sensor area and the semiconductor device area are completely separated on the substrate. Therefore, the chip area amounts to a total of the semiconductor device area and the capacitor area. Moreover, as described in Non-patent Documents 2 to 5, in order to perform highly accurate measurement with a capacitive pressure sensor, in addition to a capacitor for measurement, a reference capacitor serving as a reference of pressure and having the same structure is required. Although microfabrication of a semiconductor device can reduce the area occupied by the semiconductor device, the capacitance of these capacitors has to be large to some extent for highly accurate detection of pressure. Thus, the reduction in capacitor area has a limitation. As the semiconductor device is more microfabricated, the ratio of the area occupied by the capacitors in the chip increases. The existence of the capacitor area becomes a large restriction on reduction in chip area, thereby inhibiting the cost reduction of the semiconductor device embedded with pressure sensor.

Other than the above-described chip-area problem, the conventional technologies have manufacturing limitations. In general, a polycrystalline silicon film formed by low pressure chemical vapor deposition (CVD) has an internal stress. A large internal stress may cause the characteristic of the diaphragm to be varied with time or may cause the life of the diagraph to be reduced. To get around these problems, the internal stress has to be reduced by, for example, inserting a heat treatment after film formation.

One method of releasing the stress of a polycrystalline silicon film is described in detail in Patent Document 3. What is most concerned in this conventional technology is an influence of the heat treatment for releasing the stress of the diaphragm formed of polycrystalline silicon to be exerted on the transistor characteristic of the semiconductor device. Since the heat treatment for releasing the stress is performed at high temperatures, there is a problem that the transistor characteristic is deteriorated if this heat treatment process is inserted after the transistor is formed. The method of manufacturing a semiconductor device embedded with pressure sensor disclosed in Patent Document 3 shows a solution of the problem. By performing the activation anneal of the source and drain of the transistor and the anneal for releasing the stress of the diaphragm simultaneously, an excessive heat treatment on the transistor can be avoided, thereby preventing the deterioration in transistor performance.

However, as the semiconductor device is microfabricated more, control of the impurity distribution in the transistor is enhanced and the temperature at a heat treatment for activating impurities is reduced. In Patent Document 3, it is preferable that heat treatment temperature is 900 to 1100° C. and a heat treatment time is 20 to 40 seconds. However, a transistor resistant to such a severe heat treatment may be a transistor of a generation with a gate length of at least 1.3 μm or longer. That is, it is obvious that, with the manufacturing method disclosed in Patent Document 1, the influence on the characteristic of the microfabricated transistor cannot be suppressed. In general, along with the development of the microfabrication, the performance of semiconductor device is enhanced and the cost thereof is decreased. The impossibility of the embedding with the microfabricated semiconductor device greatly inhibits the performance enhancement and cost reduction of the semiconductor device embedded with pressure sensor.

In particular, in the semiconductor device embedded with pressure sensor for use in a tire pressure monitoring system, the embedding of a wireless circuit for transmitting and receiving a signal to and from outside of the tire is also required. To drive a wireless circuit with low power, it can be thought that a somewhat high performance CMOS transistor is required and a transistor with at least a gate length equal to or shorter than 0.8 μm is required. Thus, in the above conventional technologies, even a wireless circuit cannot be embedded on one chip, and therefore, there is no other choice but to make another chip manufactured separately from the chip of the semiconductor device embedded with pressure sensor. This another chip can be mounted in the same single package as that of the semiconductor device embedded with pressure sensor. However, as described above, effects of performance increase and cost reduction are small.

On the other hand, with some contrivance on the method and conditions of forming a polycrystalline silicon film, attempts have also been made to reduce the internal stress of the film even without performing a heat treatment at high temperatures after film formation. Furthermore, other attempts have also been made to apply a silicon germanium film with low stress to the structure of MEMS. When these films are used, a restriction occurs that a process at temperatures higher than those at the time of film formation cannot be applied after film formation. Moreover, even a process at temperatures lower than those at the time of film formation may have an influence on the internal stress of the diaphragm film. Therefore, optimization of the manufacturing method in consideration of all processes after diaphragm film formation is required. Since the semiconductor device embedded with sensor cannot be made by a manufacturing method common to other semiconductor devices, cost reduction of the semiconductor device embedded with sensor is inhibited.

Another problem of the conventional technologies is complexity in packaging. In the above-described conventional technologies, since a lower layer on the semiconductor substrate is used as a diaphragm of a pressure sensor, an opening is required to be formed thereon. On the sidewall of the opening, an interlayer insulating film or the like of the semiconductor device is exposed. To ensure reliability of the semiconductor device even without a passivation film at the portion of the through hole, special packaging technology that allows the exposed part to be protected from moisture, mobile ion, and the like is required, which leads to an increase in packaging cost. When used in a tire pressure monitoring system, since resistance to a severe environment in the tire is required, the packaging problem becomes more serious.

As described above, a first problem of the conventional technologies is that there is a limitation on reduction of the chip area of the semiconductor device embedded with pressure sensor. A second problem thereof is that the embedding of a pressure sensor poses a limitation on the method of manufacturing a semiconductor device and a restriction on the embeddable semiconductor devices. A third problem is that the embedding of a pressure sensor makes the packaging complicated.

An object of the present invention is to provide a technology capable of reducing the size of a semiconductor device embedded with pressure sensor.

Another object of the present invention is to provide a technology capable of achieving the greater functionality of a semiconductor device embedded with pressure sensor.

Still another object of the present invention is to provide a technology capable of achieving the higher reliability of a semiconductor device embedded with pressure sensor.

The above and other objects and novel characteristics of the present invention will be apparent from the description of this specification and the accompanying drawings.

The typical ones of the inventions disclosed in this application will be briefly described as follows.

A method of manufacturing a semiconductor device embedded with pressure sensor according to the present invention is characterized in that, by applying a planarization process of an insulating film by the CMP to a semiconductor device manufacturing process, a pressure detecting unit can be formed on an upper layer of the semiconductor device, and the upper two conductive layers are used for the pressure detecting unit.

That is, after an insulating film on a high-performance analog/digital combined circuit and/or a non-volatile memory circuit formed of MOS transistors formed on a semiconductor substrate is planarized by the chemical-mechanical polishing, a pressure detecting unit included in a pressure sensor on the above-mentioned circuit is formed. By doing so, a semiconductor device embedded with pressure sensor with low power consumption and a small chip area can be realized.

There are two types of the structure of the pressure detecting unit. First is that upper two conductive layers are used as capacitor electrodes and second is that the two layers of a pressure-sensitive conductive film and an electrode lower than that film are used as capacitor electrodes. It is also possible to form at least a part of the semiconductor device on a lower layer of the pressure detecting unit.

The effect obtained by the representative one of the inventions disclosed in this application will be briefly described as follows.

Since a semiconductor device can be formed on a layer located lower than a pressure detecting unit, the chip area of the semiconductor device embedded with pressure sensor can be reduced. In particular, when a pressure detecting unit using a pressure-sensitive conductive film is applied, unlike a capacitance type, it is enough to connect two or more electrodes from only the lower layers of the pressure detecting unit to the pressure-sensitive conductive film. This is advantageous in that a semiconductor device embedded with pressure sensor can be manufactured significantly easily. Also, other than the application and change of a planarization process to be performed according to need, no influence is exerted on semiconductor devices located lower than the pressure detecting unit. Therefore, no limitation occurs on the semiconductor device manufacturing method. Consequently, it is possible to embed a highly-microfabricated high-performance semiconductor device and a pressure sensor, and as a result, the low power consumption can be achieved. Furthermore, since the pressure detecting unit is formed on an upper layer of a semiconductor device and the semiconductor device is protected by a nitride film or a polyimide film, it becomes possible to simplify the packaging more than that in the conventional technologies.

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

In the first embodiment, the present invention is applied to a semiconductor device embedded with pressure sensor in which a digital circuit, an analog circuit such as an amplifier for amplifying a sensor signal and a wireless transceiver circuit, a flash memory circuit of a MONOS (Metal Oxide Nitride Oxide) type, a capacitive pressure sensor and the like are embedded together on one chip.

Figure 1:
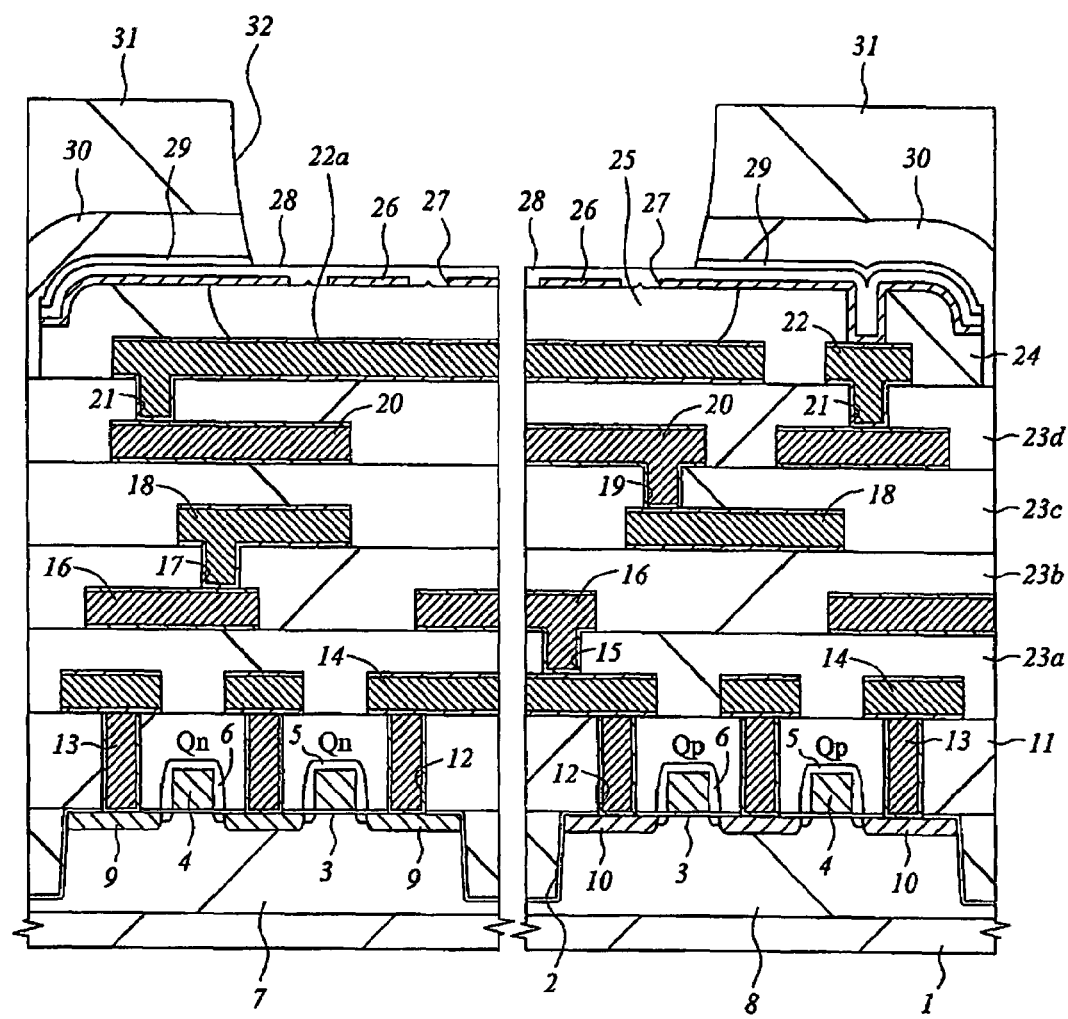
FIG. 1 is a section view of main components including a pressure detecting unit of a semiconductor device embedded with pressure sensor according to an embodiment of the present invention.

FIG. 1 is a section view of main components including a pressure detecting unit of a semiconductor device embedded with pressure sensor according to the first embodiment. On the surface of a silicon substrate 1, a trench isolation 2 is formed, and MOS (Metal Oxide semiconductor) transistors (Qn, Qp) having a gate oxide film 3, a gate electrode 4 formed of a polycide film, a cap insulating film 5, a side wall 6, and others are formed. The n channel type MOS transistor (Qn) is formed on a p type well 7, and the p channel type MOS transistor (Qp) is formed on an n type well 8. The minimum gate length of the MOS transistors (Qn, Qp) is 0.35 μm.

On the upper portion of the MOS transistors (Qn, Qp), a silicon oxide film 11 is formed. On each of the upper portion of a diffusion layer (source, drain) 9 of the MOS transistor (Qn) and the upper portion of a diffusion layer (source, drain) 10 of the MOS transistor (Qp), a contact hole 12 is formed. Inside the contact hole 12, a plug 13 formed of a titanium nitride film and a tungsten film is formed.

On the upper portion of the silicon oxide film 11, a first layer wiring 14 connected to the plug 13 is formed. The first layer wiring 14 is formed of a titanium nitride film, an aluminum alloy film, a titanium nitride film, and a titanium film in this order from above. On the upper portion of the first layer wiring 14, a second layer wiring 16 connected to the first layer wiring 14 via a via hole 15, a third layer wiring 18 connected to the second layer wiring 16 via a via hole 17, a fourth layer wiring 20 connected to the third layer wiring 18 via a via hole 19, and a fifth layer wiring 22 connected to the fourth layer wiring 20 via a via hole 21 are formed. Similar to the first layer wiring 14, each of the second layer wiring 16 to the fifth layer wiring 22 is formed of a titanium nitride film, an aluminum alloy film, a titanium nitride film, and a titanium film.

The first layer wiring 14 to the fifth layer wiring 22 are insulated from each other by interlayer insulating films 23 made of silicon oxide. In the manufacture of a semiconductor device according to this embodiment, the CMP is used at the key steps. Therefore, each of the first layer wiring 14 to the fifth layer wiring 22 is formed to be approximately flat, and also the surface of the fifth layer wiring 22 is approximately flat.

In the semiconductor device embedded with pressure sensor according to this embodiment, a part of the fifth layer wiring 22 is used as a lower electrode 22a of a pressure detecting unit. A part of silicon oxide film 24 formed on the lower electrode 22a is a cavity 25, and the cavity 25 is filled with gas at approximately 1 atmospheric pressure containing nitrogen as the main component. A part of a tungsten silicide film 26 formed on the silicon oxide film 24 has holes 27, through which hydrofluoric acid is introduced to form the cavity 25 in the silicon oxide film 24.

On the tungsten silicide film 26, a silicon nitride film 28 formed by plasma CVD (Chemical Vapor Deposition) is formed. The silicon nitride film 28 has a function to fill the holes 27 and suppress the immersion of moisture from outside into the semiconductor device embedded with pressure sensor. In this embodiment, the laminated layer of the silicon nitride film 28 and the tungsten silicide film 26 serves as a diaphragm. The tungsten silicide film 26 which forms a part of the diaphragm is connected to the fifth layer wiring 22 via a via hole 45. On the upper layer of a part of the silicon nitride film 28, a silicon oxide film 29, a silicon nitride film 30, and a photosensitive polyimide film 31 are formed.

Each of the part of the MOS transistors (Qn, Qp) and the first layer wiring 14 to the fifth layer wiring 22 form a digital circuit. Since a part of the fifth layer wiring 22 is connected to the diaphragm of the pressure detecting unit and the lower electrode 22a, it forms a part of an analog circuit. However, except for a wiring that connects between electrodes, the pressure detecting unit is not located on the analog circuit, but is formed on the digital circuit. This is in order to prevent the electrical charge stored in a capacitor of the pressure detecting unit from causing the noise on the analog circuit so as to achieve the pressure detection with high accuracy.

Figure 2:
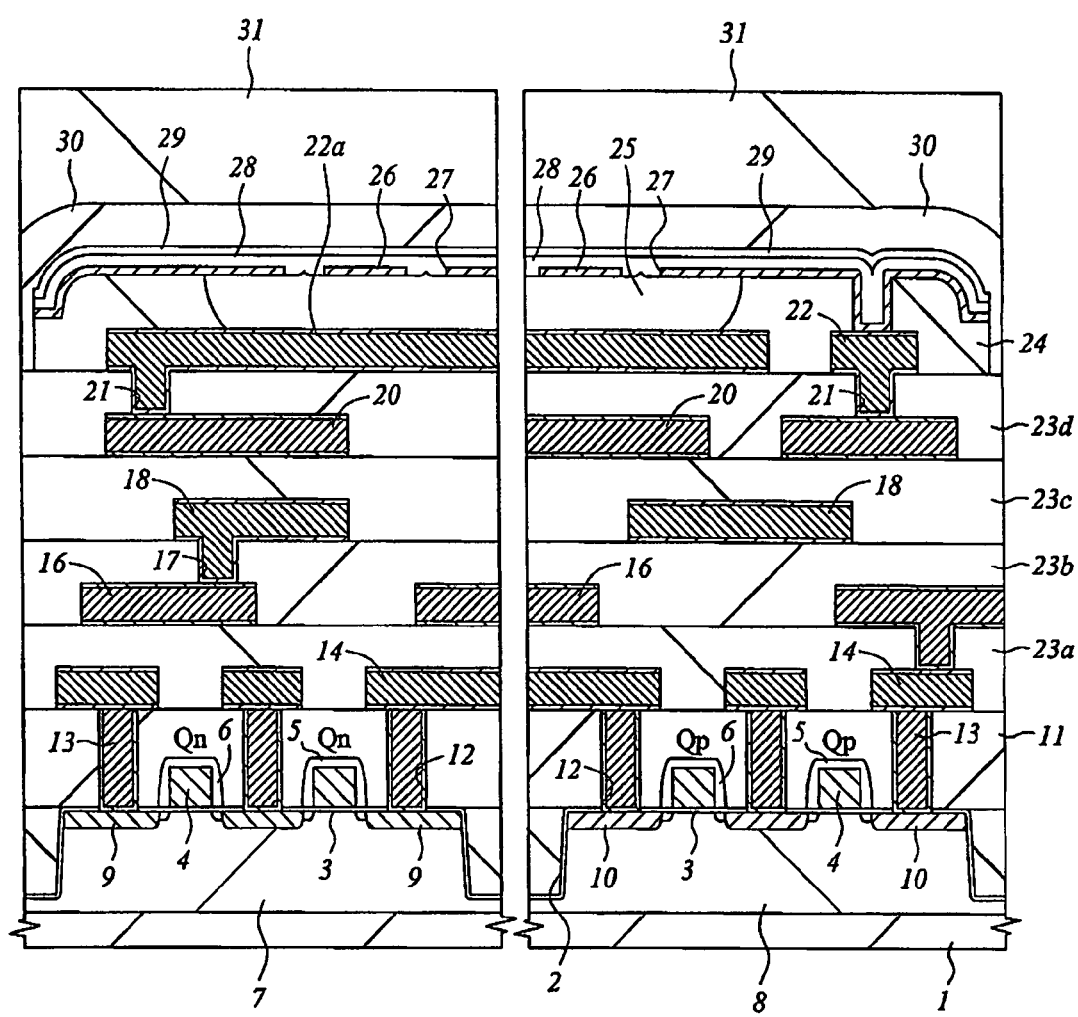
FIG. 2 is a section view of main comments including a reference capacitor unit of the semiconductor device embedded with pressure sensor according to an embodiment of the present invention.

FIG. 2 is another section view, different from FIG. 1, of the semiconductor device embedded with pressure sensor according to this embodiment. This section includes a reference capacitor unit. The silicon substrate 1 to the fifth layer wiring 22 and further to the diaphragm formed of the silicon nitride film 28 and the tungsten silicide film 26 are similar to those of the pressure detecting unit shown in FIG. 1. A major difference from the pressure detecting unit shown in FIG. 1 is that the photosensitive polyimide film 31, the silicon nitride film 30, and the silicon oxide film 29 on the diaphragm are not removed. Therefore, the reference capacitor unit does not directly suffer from variations by outer pressure. Each part of the MOS transistors (Qn, Qp) and the first layer wiring 14 to the fifth layer wiring 22 on this section form a digital circuit.

Since a part of the fifth layer wiring 22 is connected to the lower electrode 22a of the reference capacitor, it forms a part of an analog circuit. However, except for a wiring that connects between electrodes, the pressure detecting unit is not located on the digital circuit, and the reference capacitor unit is not located on the digital circuit. This is in order to prevent the electrical charge stored in a capacitor of the reference capacitor unit from causing the noise on the analog circuit so as to achieve the pressure detection with high accuracy.

Figure 3:
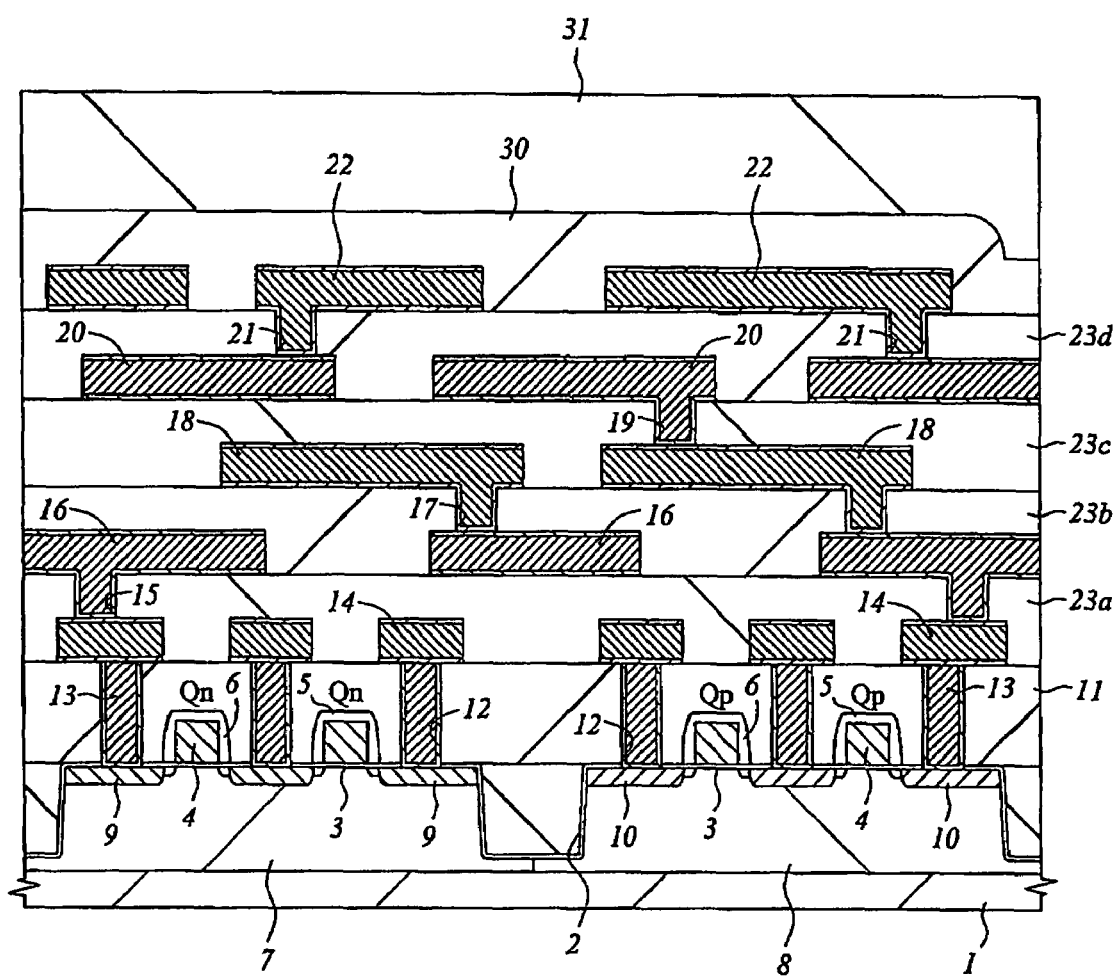
FIG. 3 is a section view of main components including an analog circuit unit of the semiconductor device embedded with pressure sensor according to an embodiment of the present invention.

FIG. 3 is still another section view, different from FIG. 1 and FIG. 2, of the semiconductor device embedded with pressure sensor according to this embodiment. This section is a section of the analog circuit unit, and each of the MOS transistors (Qn, Qp) and the first layer wiring 14 to the fifth layer wiring 22 form the analog circuit. The top of the fifth layer wiring is covered with the silicon nitride film 30 and the photosensitive polyimide film 31.

Figure 4:
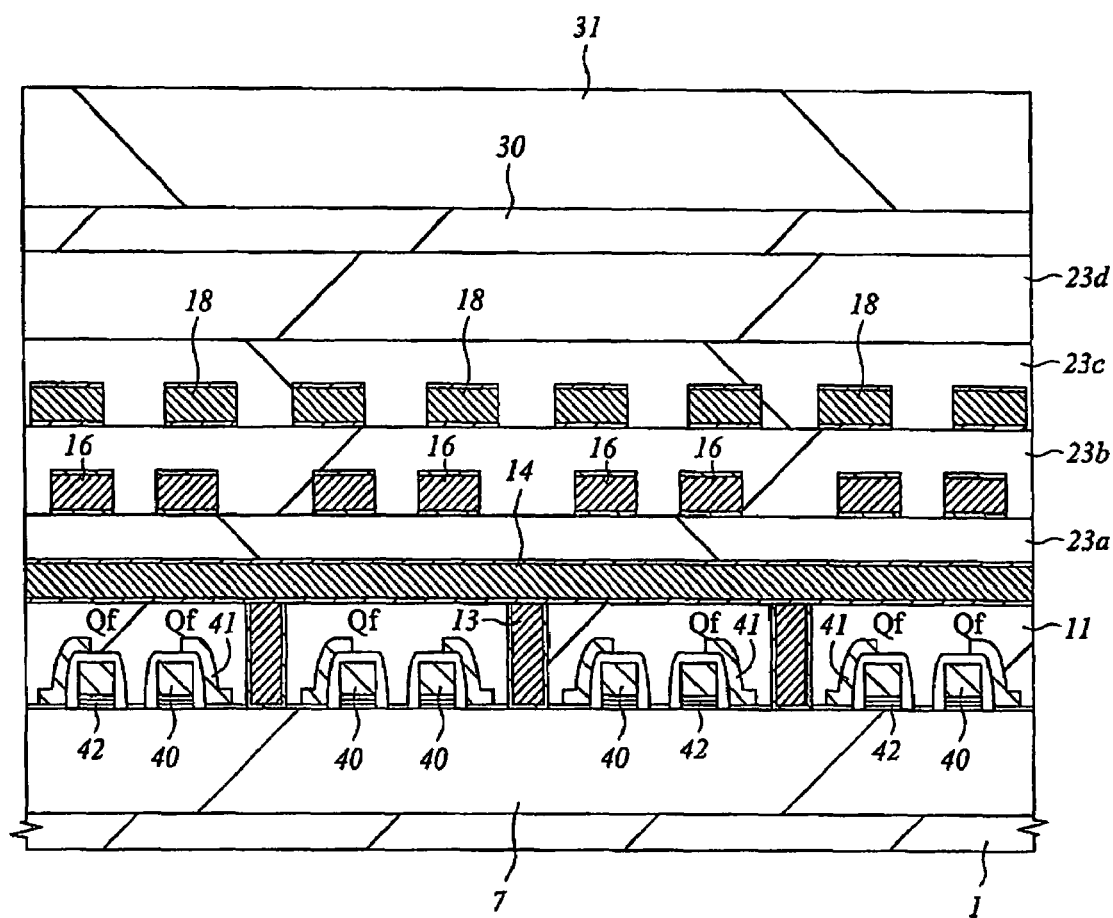
FIG. 4 is a section view of main components including a flash memory circuit unit of the semiconductor device embedded with pressure sensor according to an embodiment of the present invention.

FIG. 4 is still another section view, different from FIG. 1 to FIG. 3, of the semiconductor device embedded with pressure sensor according to this embodiment. This section is a section of a flash memory circuit unit, and the first layer wiring 14, the second layer wiring 16 and the third layer wiring 18 are formed on a MONOS-type flash memory transistor (Qf) having a memory gate 40 and a control gate 41. Since the control gate 41 is formed at the same time when the gate electrode 4 composed of a polycide film is formed, it has the same film thickness as that of the gate electrode 4 in practice.

In the flash memory circuit unit, only the above-mentioned three of five layer wirings (first layer wiring 14 to fifth layer wiring 22) are used. Therefore, although the upper wiring layers can be used as a pressure detecting unit and/or a reference capacitor unit, no pressure detecting unit or reference capacitor is disposed on the flash memory circuit in this embodiment because memory capacity to be mounted is small. A pressure detecting unit and/or a reference capacitor may be formed on the flash memory circuit.

Figure 5:
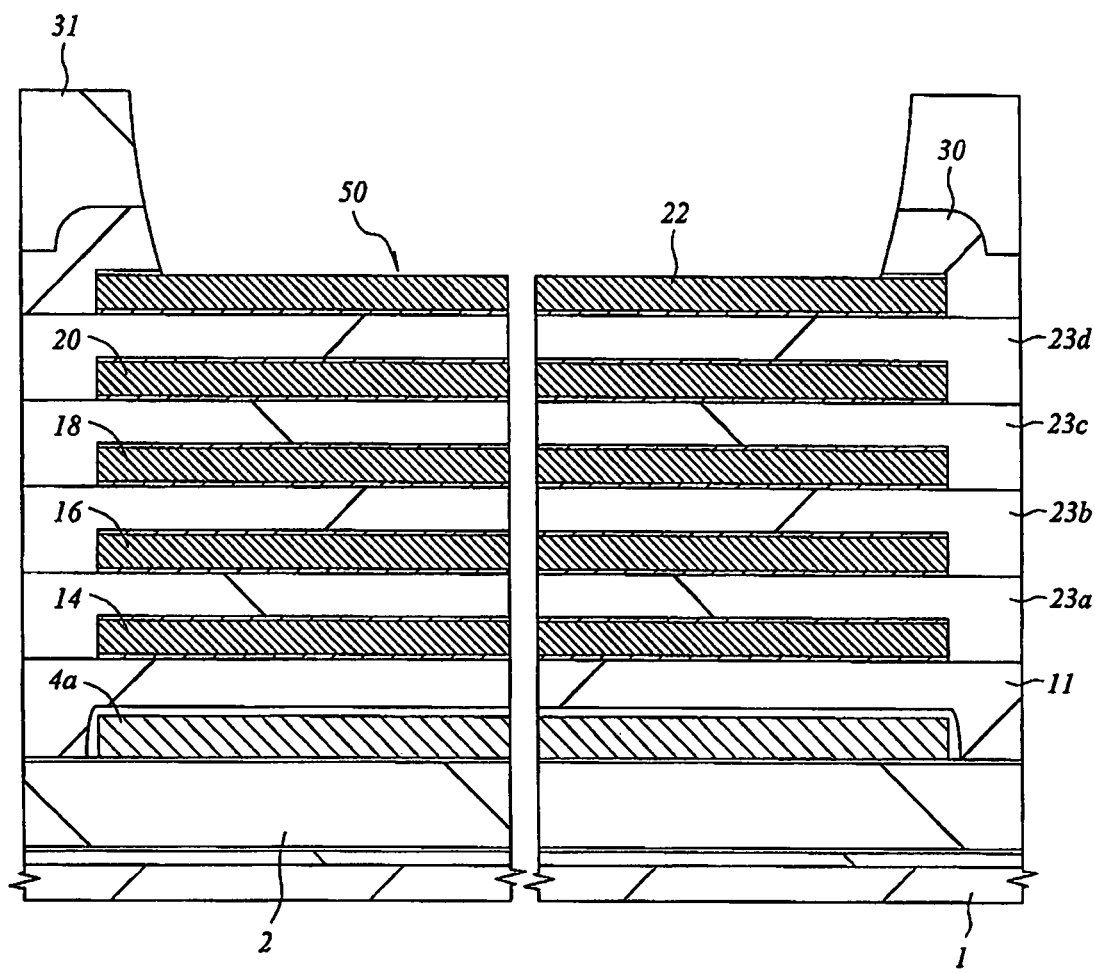
FIG. 5 is a section view of main components including a pad portion of the semiconductor device embedded with pressure sensor according to an embodiment of the present invention.

FIG. 5 is still another section view, different from FIG. 1 to FIG. 4, of the semiconductor device embedded with pressure sensor according to this embodiment. This section is a section including a pad portion. Since the CMP is used at the key steps in the course of the manufacturing process of the semiconductor device in this embodiment, the wiring layers are approximately planarized. However, even in many other semiconductor devices manufactured without using the CMP, the pad portion is often flat. In this embodiment, no pressure detecting unit or reference capacitor is disposed on a pad 50, but a pressure detecting unit and/or reference capacitor may be formed on the pad 50.

On the upper portion of the polycide film 4a, the pad 50 is formed of a stack of the first layer wiring 14 to the fifth layer wiring 22 and these wiring layers are connected to each other via many via holes and the like in many cases. Since FIG. 5 shows a section not including via holes, these via holes are not shown. On the surface of the pad 50, of the materials forming the fifth layer wiring 22, the titanium nitride film of the uppermost layer is removed by the etching, and the aluminum alloy layer is exposed. The periphery of the pad 50 is covered with the silicon nitride film 30 and the photosensitive polyimide film 31.

Figure 6:
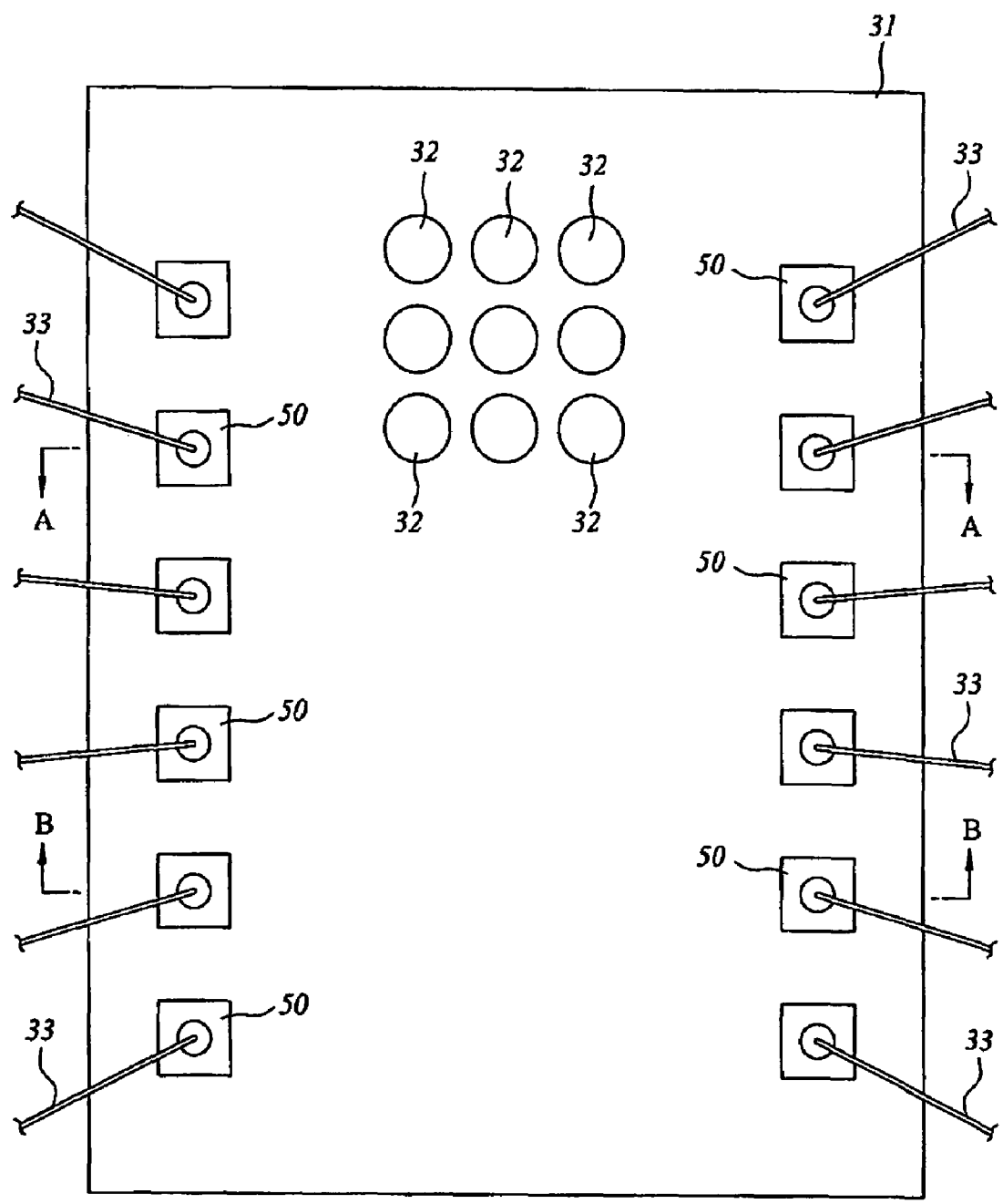
FIG. 6 is a plan view of the semiconductor device embedded with pressure sensor after wire bonding.

FIG. 6 is a view of the semiconductor device embedded with pressure sensor according to this embodiment viewed from the top after wire bonging. Openings 32 are formed in a part of the photosensitive polyimide film 31 on the surface of the semiconductor device, and the diaphragms of the pressure detecting units are exposed on the bottom portion of the openings 32. Also, on the other area of the photosensitive polyimide film 31, pads 50 for bonding are exposed, and gold wires 33 are connected to the surface of the pads 50.

Figure 7:
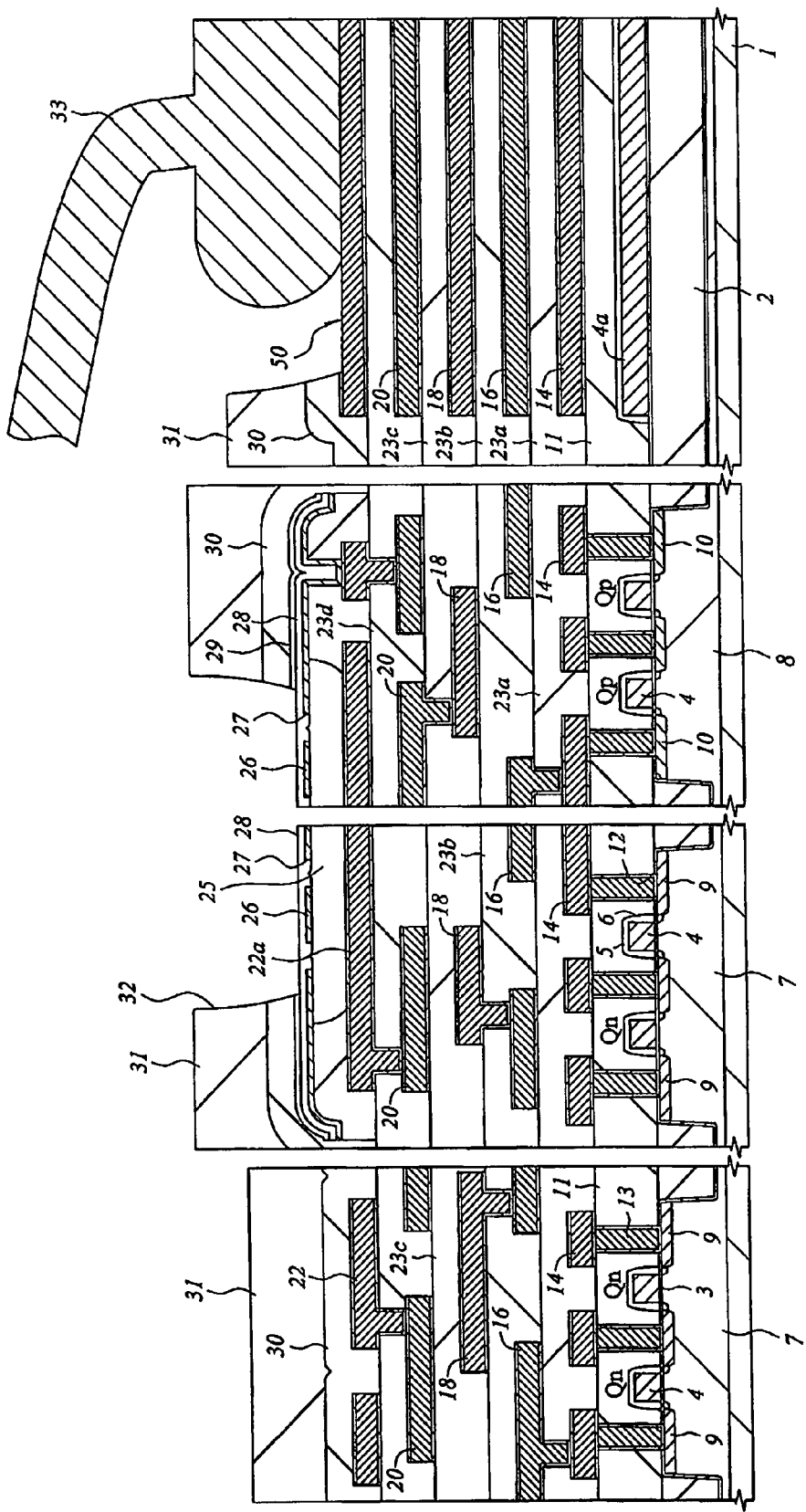
FIG. 7 is a section view of the semiconductor device embedded with pressure sensor taken along the line A-A of FIG. 6.

FIG. 7 is a section view of the semiconductor device embedded with pressure sensor taken along the line A-A of FIG. 6. An area at the left end represents the analog circuit unit, two areas at the center represent the pressure detecting unit, and an area at the right end represents the pad portion. Except the pressure detecting unit and the pad portion, the areas are covered with the silicon nitride film 30 and the photosensitive polyimide film 31. The top of the diaphragm of the pressure detecting unit is covered with the silicon nitride film 28.

Figure 8:
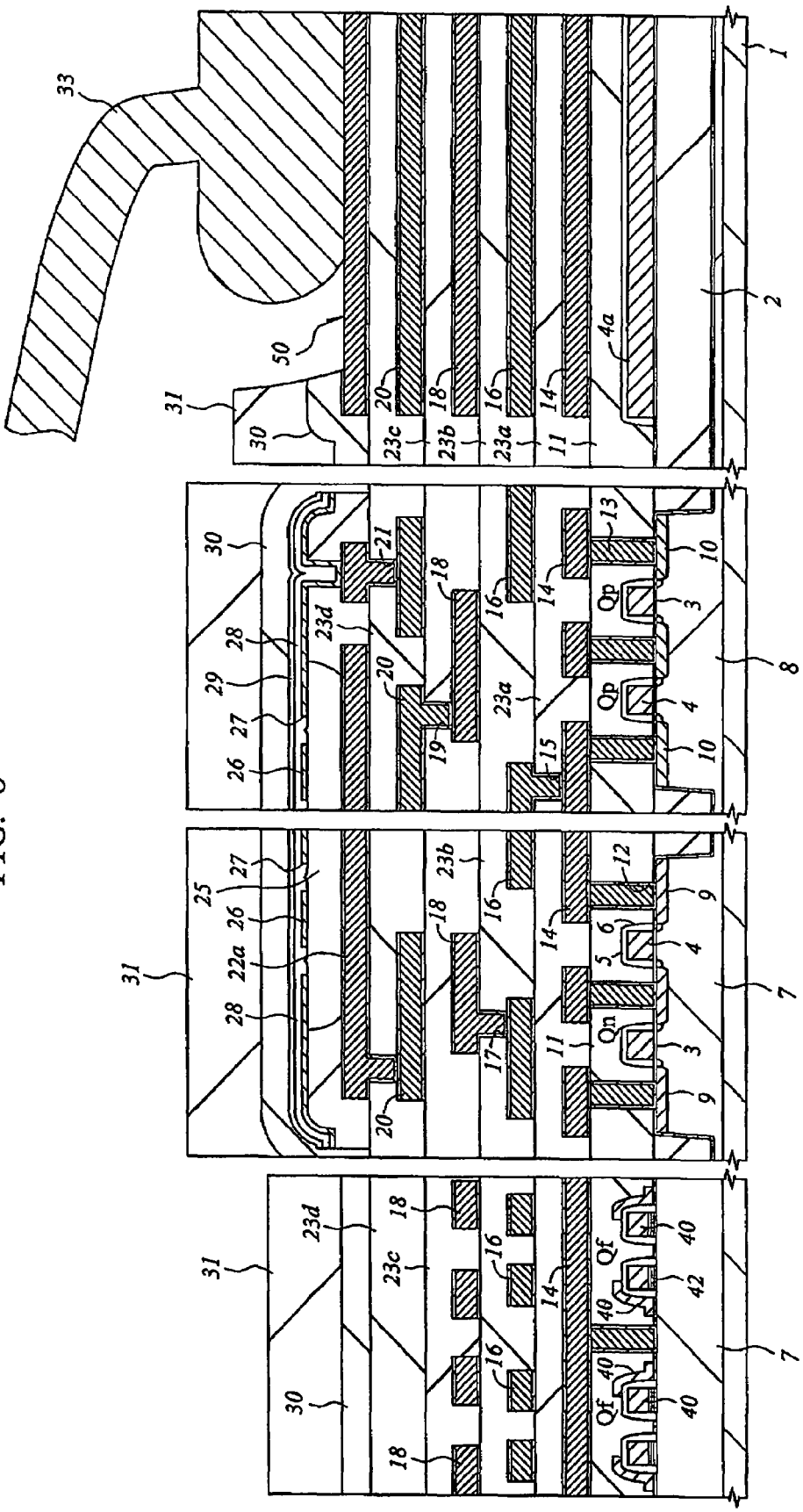
FIG. 8 is a section view of the semiconductor device embedded with pressure sensor taken along the line B-B of FIG. 6.

FIG. 8 is a section view of the semiconductor device embedded with pressure sensor taken along the line B-B of FIG. 6. An area at the left end represents the flash memory circuit unit, two areas at the center represent the reference capacitor unit, and an area at the right end represents the pad portion. Except the pad portion connected with the gold wire 33, the areas including the top of the diaphragm of the reference capacitor unit are covered with the silicon nitride film 30 and the photosensitive polyimide film 31.

Figure 9:
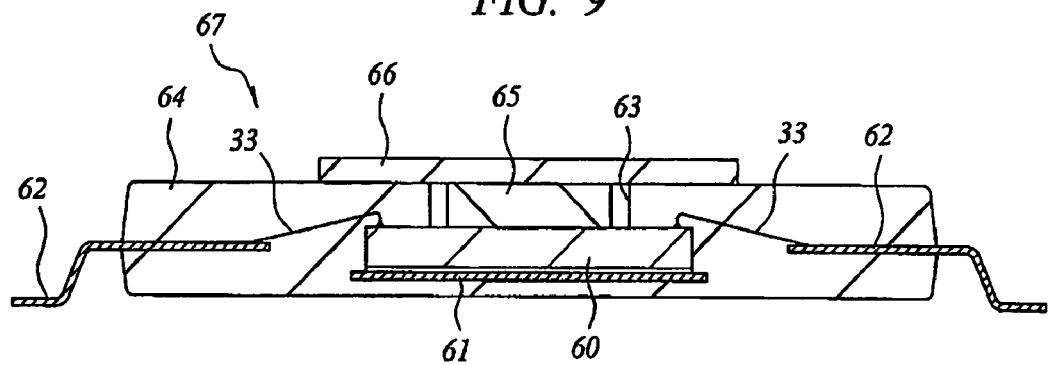
FIG. 9 is a section view of a package in which the semiconductor device embedded with pressure sensor according to an embodiment of the present invention is packaged.

FIG. 9 is a section view of a package having the semiconductor device embedded with pressure sensor implemented thereon according to this embodiment. A semiconductor device embedded with pressure sensor 60 is fixed onto a die pad portion 61 and is electrically connected to a lead 62 by the gold wire 33. This package 67 is a plastic-mold-type package using a cylinder 63, and the semiconductor device embedded with pressure sensor 60 and the gold wire 33 are sealed by mold resin 64. The inside of the cylinder 63 is filled with silicone gel 65, and its surface is filled by a resin film 66. This resin film 66 is deformed by pressure applied from outside to add pressure on the silicone gel 65. Then, the pressure transmitted via the silicone gel 65 is detected by the pressure detecting unit of the semiconductor device embedded with pressure sensor 60.

Figure 10:
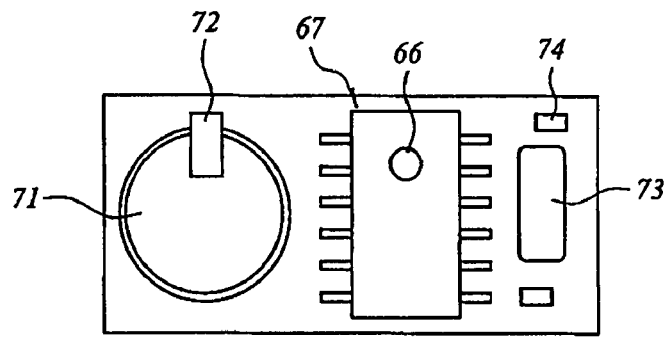
FIG. 10 is a plan view of a printed circuit board for a tire pressure monitoring system in which the semiconductor device embedded with pressure sensor according to an embodiment of the present invention is packaged.

FIG. 10 is a plan view of a printed circuit board for a tire pressure monitoring system having the semiconductor device embedded with pressure sensor implemented thereon according to this embodiment. On a printed circuit board 70, a button battery 71 is fixed. The button battery 71 is electrically connected to the printed circuit board 70 via a terminal 72. Also, on the printed circuit board 70, the package 67 shown in FIG. 9, a crystal resonator 73, a passive elements 74 for an RF circuit, and the like are implemented. On an opposite surface of the printed circuit board 70, an antenna (not shown) is provided.

Figure 11:
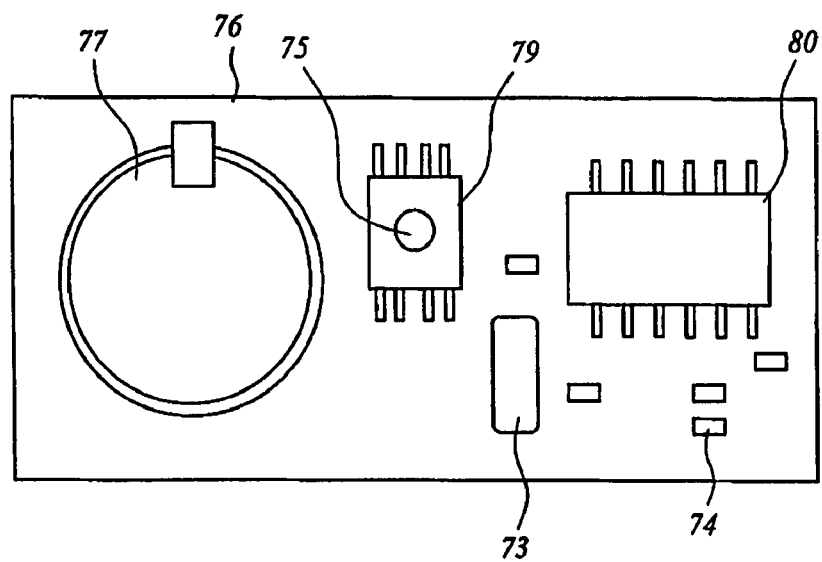
FIG. 11 is a plan view of a printed circuit board for a tire pressure monitoring system including a package in which a conventional semiconductor device embedded with pressure sensor is packaged.

On the other hand, FIG. 11 is a plan view of a printed circuit board for a tire pressure monitoring system including a package having a conventional semiconductor device embedded with pressure sensor implemented thereon. On a printed circuit board 76, a button battery 77 is fixed. The button battery 77 is electrically connected to the printed circuit board 76 via a terminal 78. Also, on the printed circuit board 76, a package 79 in which a conventional semiconductor device embedded with pressure sensor having an opening for detecting pressure whose surface is sealed by a film 75, a package 80 accommodating a semiconductor device provided with a wireless circuit unit and a semiconductor device provided with a digital circuit unit or the like, the crystal resonator 73, passive elements 74 for an RF circuit, and the like are implemented. On an opposite surface of the printed circuit board 76, an antenna (not shown) is provided.

When comparing the sizes of the printed circuit board 70 of FIG. 10 on which the semiconductor device embedded with pressure sensor 60 according to this embodiment is implemented and the printed circuit board 76 of FIG. 11 on which the conventional semiconductor device embedded with pressure sensor is implemented, the printed circuit board 70 is approximately one-third smaller then the printed circuit board 76. This is because, since the integration degree of the semiconductor device embedded with pressure sensor 60 according to this embodiment is higher, components corresponding to the package 80 of FIG. 11 are not necessary, and since the semiconductor device embedded with pressure sensor 60 according to this embodiment requires lower power consumption, the capacity of the button battery 71 required for obtaining the same life can be small. The button battery 77 has a capacity of an approximately half of that of the button battery 71, and therefore, its size and thickness are smaller accordingly. As described above, according to this embodiment, the small-sized printed circuit board 70 for a tire pressure monitoring system with low power consumption can be achieved.

Figure 12:
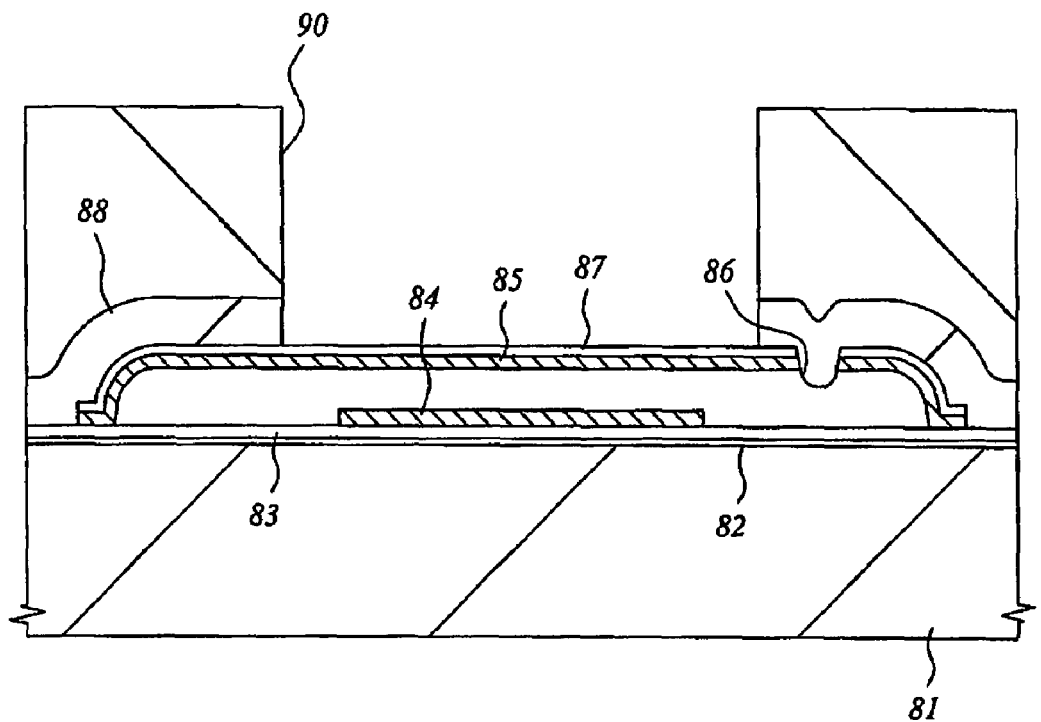
FIG. 12 is a section view of a pressure detecting unit of a conventional semiconductor device embedded with pressure sensor.

FIG. 12 is a section view of a pressure detecting unit of the conventional semiconductor device embedded with pressure sensor. On the surface of a silicon substrate 81, a silicon oxide film 82 is formed, and a silicon nitride film 83 is formed thereon. A lower electrode 84 fixed onto the silicon nitride film 83 and a diaphragm 85 are both formed of polycrystalline silicon films doped with impurities. A space between the lower electrode 84 and the diaphragm 85 is vacuum. A hole 86 once opened in a part of the diaphragm 85 in the course of the manufacturing process is filled with a silicon nitride film 87 and a silicon oxide film 88 formed on the diaphragm 85.

On the silicon oxide film 88, an interlayer insulating film 89 made of a silicon oxide based material is formed. However, this interlayer insulating film 89 is removed only on the upper portion of the diaphragm 85 and an opening portion 90 is formed. Since the interlayer insulating film 89 is exposed on the sidewall of the opening portion 90, there is a possibility that moisture comes into the diaphragm 85. For its prevention, special contrivance is required for the packaging of the semiconductor device embedded with pressure sensor. Therefore, the manufacturing cost is increased.

The printed circuit board 70 shown in FIG. 10 and the printed circuit board 76 shown in FIG. 11 are installed in an environment simulating the inside of a tire by the same packaging technology to evaluate life and stability. As a result, the printed circuit board 70 using the semiconductor device embedded with pressure sensor 60 according to this embodiment has a longer life and better stability. The life is evaluated with acceleration in an environment at high temperature and humidity. When the printed circuit board 76 having the semiconductor device embedded with pressure sensor implemented thereon of the conventional technology is used, the life is as short as less than ten years in actual use conditions. On the other hand, in the case of the printed circuit board 70 having the semiconductor device embedded with pressure sensor 60 according to this embodiment implemented thereon, the life longer than ten years is obtained.

Also, in the printed circuit board 76 provided with the conventional semiconductor device embedded with pressure sensor, change with time is observed in the pressure detection. On the other hand, in the printed circuit board 70 provided with the semiconductor device embedded with pressure sensor 60 according to the present invention, no change with time is observed. This difference therebetween is thought to occur due to the following reason. The semiconductor device embedded with pressure sensor 60 according to this embodiment has its surface protected by the silicon nitride film 30 and the photosensitive polyimide film 31. On the other hand, in the conventional semiconductor device embedded with pressure sensor shown in FIG. 12, the diaphragm 85 for detecting pressure is near the silicon substrate 81, and the opening portion 90 from the surface of the semiconductor device to the diaphragm 85 is formed. Since the sidewall of the opening portion 90 is not protected by a silicon nitride film or a photosensitive polyimide film, moisture in the tire might permeate the semiconductor device to shorten the life of the semiconductor device and reduce the stability. As described above, according to this embodiment, the semiconductor device embedded with pressure sensor 60 with long life, high accuracy and stability, the printed circuit board 70 for a tire pressure monitoring system and further a tire pressure monitoring system can be achieved.

Next, a method of manufacturing a semiconductor device embedded with pressure sensor according to this embodiment will be described with reference to FIG. 13 to FIG. 23. A critical dimension of the semiconductor device embedded with pressure sensor is 0.35 µm.

Figure 13:
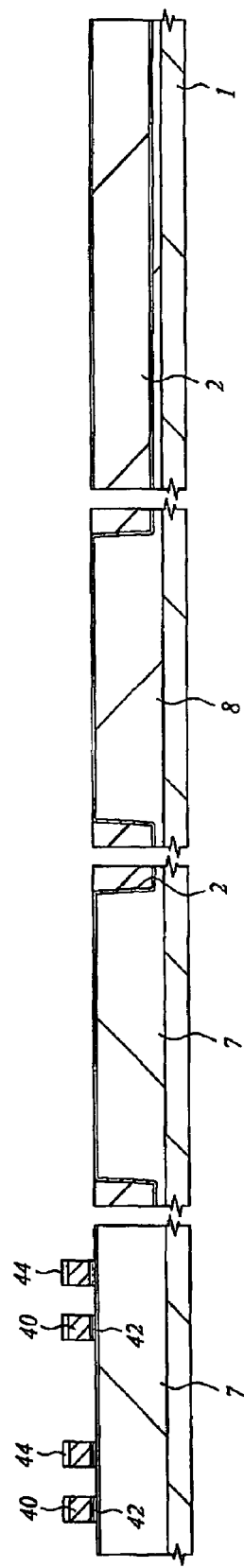
FIG. 13 is a section view showing a method of manufacturing a semiconductor device embedded with pressure sensor according to an embodiment of the present invention.

First, a trench isolation 2 is formed on a main surface of a silicon substrate 1 shown in FIG. 13 by using the STI (Shallow Trench Isolation) technology, and then, photolithography technology and ion implantation technology are used to implant phosphorus ions in an n type well forming area and implant boron ions in a p type well forming area. Subsequently, with a heat treatment at 1050° C. for 60 minutes, impurities implanted in the silicon substrate 1 are diffused and activated to form a p type well 7 and an n type well 8. Note that an area at the left end in FIG. 13 represents the flash memory circuit unit, two areas at the center represent the pressure detecting unit, and an area at the right end represents the pad portion. Also, the isolation method is not limited to a method using the trench isolation 2, but may be a method using a field insulating film formed by a LOCOS (Local oxidation of silicon) method.

Next, a silicon oxide film, a silicon nitride film, and a silicon oxide film are laminated on the silicon substrate 1 to form an ONO film 42. The silicon oxide film of the lower layer is formed by thermal oxidation of the surface of the silicon substrate 1, and the silicon nitride film is formed by the low pressure CVD, and the silicon oxide film of the upper layer is formed by thermal oxidation of the surface of the silicon nitride film. The silicon oxide film of the lower layer has a thickness of 1.5 nm.

Next, a polycrystalline silicon film having a thickness of 200 nm and a cap insulating film 44 are deposited on the ONO film 42. The polycrystalline silicon film is formed by the low pressure CVD with using monosilane as a source material. The substrate temperature is set at 650° C. After the ion implantation of phosphorus into the polycrystalline silicon film, a heat treatment for activating the polycrystalline silicon film is performed in nitrogen atmosphere. The heat treatment temperature is 900° C., and the heat treatment time is 30 minutes. At this time, crystal grains in the polycrystalline silicon film grow to become large. The cap insulating film 44 is formed of a laminated film of a silicon oxide film and a silicon nitride film deposited by the low pressure CVD. The substrate temperature at the time of forming the cap insulating film 44 is 800° C. at maxinum.

Next, after the dry etching of the cap insulating film 44 with using a photoresist film as a mask, the polycrystalline silicon film is dry-etched with using the cap insulating film 44 as a mask. By doing so, the memory gate 40 of the MONOS-type flash memory is formed on the ONO film 42 of the flash memory circuit unit. At this time, in the area other than the lower portion of the memory gate 40, the silicon nitride film which is a part of the ONO film 42 is exposed. Therefore, the light oxidization is performed in oxygen atmosphere at 800° C. to oxidize the edge of the memory gate 40, and then, this silicon nitride film is removed with using hot phosphoric acid.

Figure 14:
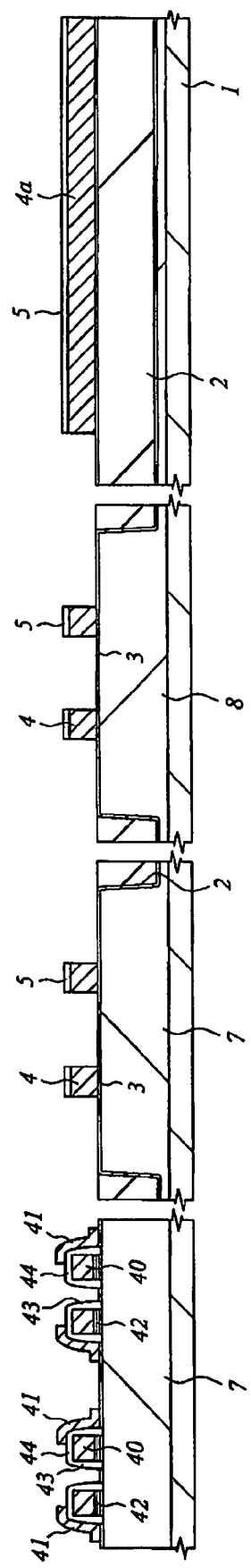
FIG. 14 is a section view showing the method of manufacturing a semiconductor device embedded with pressure sensor subsequent to FIG. 13.

Next, as shown in FIG. 14, the control gate 41 is formed on the flash memory circuit unit, and the gate electrode 4 is formed on the digital circuit unit and the analog circuit unit.

The control gate 41 and the gate electrode 4 are formed in the manner as follows. That is, the surface of the silicon substrate 1 is thermally oxidized to form the gate oxide film 3, and then, a silicon oxide film is formed by the low pressure CVD. Thereafter, by the anisotropic etching of this silicon oxide film, a sidewall 43 is formed on the sidewall of the memory gate 40.

Next, a polycide film 4a formed of a polycrystalline silicon film doped with phosphorus and a tungsten silicide film is deposited. The polycrystalline silicon film is deposited by the low pressure CVD with using monosilane and phosphine as source materials. The substrate temperature at this time is 580° C. Next, by the low pressure CVD with using tungsten hexafluoride and dichlorosilane as source materials, a tungsten silicide film is formed. The substrate temperature at this time is 560° C.

Next, the cap insulating film 5 formed of a silicon oxide film is deposited on the polycide film 4a. The cap insulating film 5 is formed by the low pressure CVD at 650° C. with using Tetra Ethyl Ortho Silicate (TEOS) and oxygen as source materials. Then, after the dry etching of the insulating film 5 with using a photoresist film as a mask, the polycide film 4a is dry-etched with using the cap insulating film 5 as a mask. By doing so, the gate electrode 4 is formed on each of the digital circuit unit and the analog circuit unit and the control gate 41 is formed on the flash memory circuit unit. The gate length of the gate electrode 4 is 0.35 µm at minimum. The control gate 41 has a shape being laid over the memory gate 40.

Figure 15:
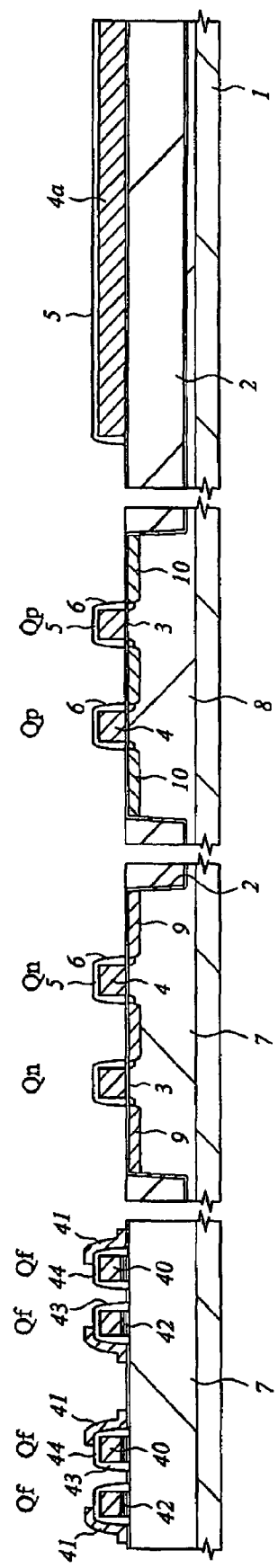
FIG. 15 is a section view showing the method of manufacturing a semiconductor device embedded with pressure sensor subsequent to FIG. 14.

Next, as shown in FIG. 15, the MOS transistors (Qn, Qp) are formed on the digital circuit unit and the analog circuit unit, and the MONOS-type flash memory transistors (Qf) are formed on the flash memory circuit unit. First, after impurities are ion-implanted to the p type well 7 and the n type well 8, a silicon oxide film is formed by the low pressure CVD. Then, by the anisotropic etching of this silicon oxide film, the sidewall 6 is formed on the sidewall of the gate electrode 4.

Next, after the ion implanting of the impurities into the p type well 7 and the n type well 8, a heat treatment is performed at 850° C. for 15 minutes to activate the impurities by doing so, the source and the drain (diffusion layers 9 and 10) are formed. Also, by the above-described ion implantation of impurities, a pn junction (not shown) is also formed, and simultaneously a detecting unit of a temperature sensor by a pn junction diode is formed.

Figure 16:
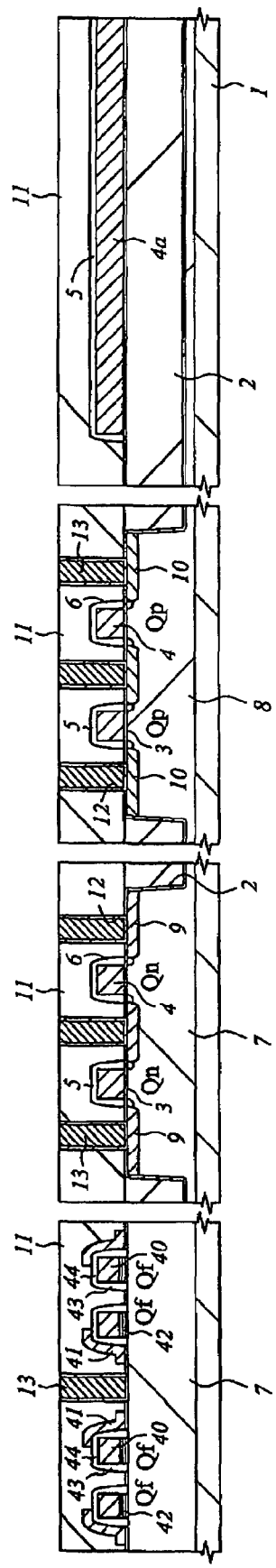
FIG. 16 is a section view showing the method of manufacturing a semiconductor device embedded with pressure sensor subsequent to FIG. 15.

Next, as shown in FIG. 16, after the silicon oxide film 11 having a thickness of 700 nm is formed on the upper layer of the transistors (Qn, Qp, Qf) by the plasma CVD using high-density plasma with using TEOS and oxygen as source materials, the silicon oxide film 11 is polished by about 400 nm by a CMP so as to planarize the surface thereof.

Next, after the contact hole 12 is formed in the silicon oxide film 11 by dry etching with using a photoresist film as a mask, the plug 13 is formed inside of the contact hole 12. The plug 13 is formed in the manner as follows. First, a titanium film and a titanium nitride film are sequentially deposited by the sputtering method, and a heat treatment is performed in a nitrogen atmosphere at 650° C. for 30 minutes. With this heat treatment, titanium is reacted with silicon on the substrate surface to form titanium silicide. Therefore, it is possible to reduce the contact resistance. Next, after a tungsten film is deposited by the CVD with using tungsten hexafluoride and hydrogen as source materials, the titanium film, the titanium nitride film, and the tungsten film are etched back. Also, these films may be polished by a CMP instead of the etch back.

Figure 17:
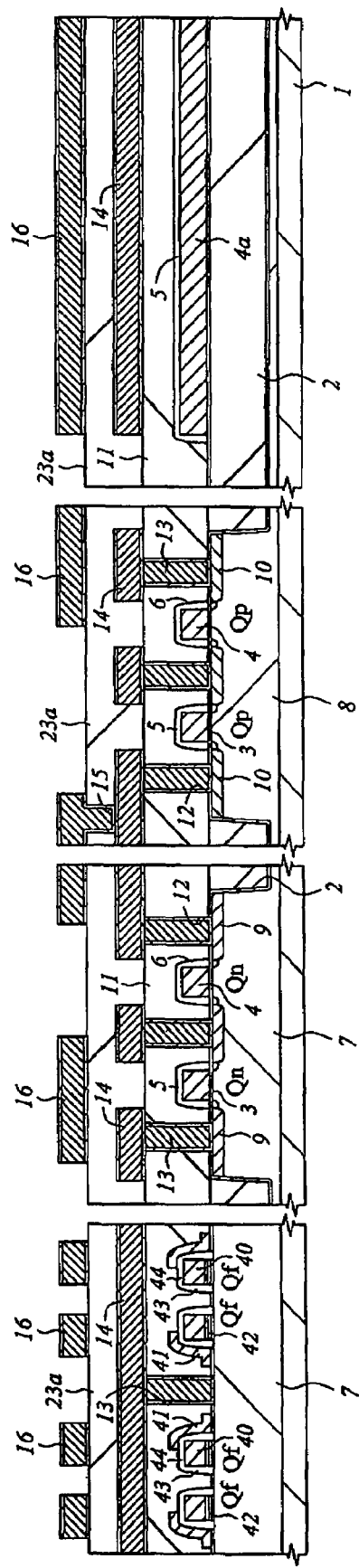
FIG. 17 is a section view showing the method of manufacturing a semiconductor device embedded with pressure sensor subsequent to FIG. 16.

Next, as shown in FIG. 17, the first layer wiring 14, the interlayer insulating film 23, and the second layer wiring 16 are sequentially formed on the silicon oxide film 11. The first layer wiring 14 is formed by sequentially forming an aluminum alloy film containing 0.5% of copper and a titanium nitride film on the silicon oxide film 11 by a sputtering method, and then patterning these films by dry etching with using a photoresist film as a mask. The interlayer insulating film 23 is formed by depositing a silicon oxide film having a thickness of 700 nm by the plasma CVD with using TEOS and oxygen as source materials and then polishing its surface by 300 nm to be planarized. Next, by dry etching with using a photoresist film as a mask, a via hole 15 is formed in the interlayer insulating film 23, and then a titanium film, a titanium nitride film, an aluminum alloy film containing 0.5% of copper, and a titanium nitride film are deposited on the interlayer insulating film 23 by a sputtering method. Subsequently, these films are patterned by dry etching with using a photoresist film as a mask. By doing so, the second layer wiring 16 is formed.

Figure 18:
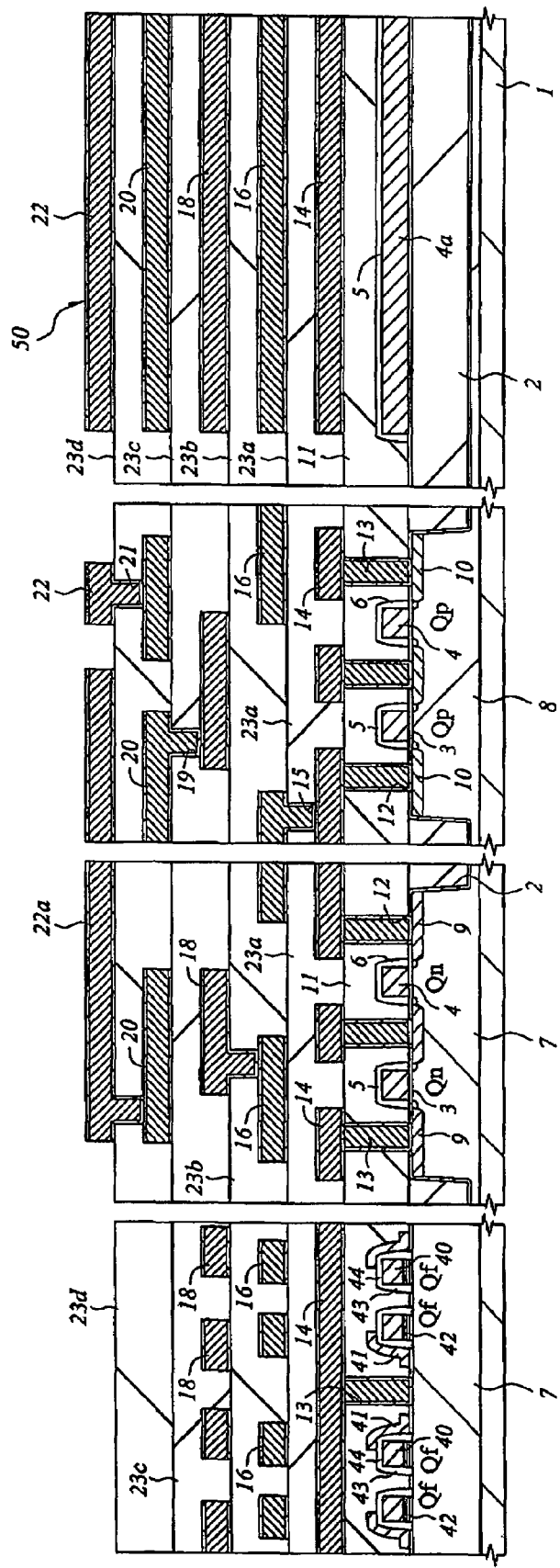
FIG. 18 is a section view showing the method of manufacturing a semiconductor device embedded with pressure sensor subsequent to FIG. 17.

Next, as shown in FIG. 18, the third layer wiring 18, the fourth layer wiring 20, and the fifth layer wiring 22 are sequentially formed on the upper layer of the second layer wiring 16 via the interlayer insulating film 23. The third layer wiring 18 to the fifth layer wiring 22 are formed in the manner similar to that of the second layer wiring 16. A part of the fifth layer wiring 22 formed in the pressure detecting unit is the lower electrode 22a. The shape of the lower electrode 22a viewed from the top is a circle having a diameter of 37 µm. Also, with the first layer wiring 14 to the fifth layer wiring 22, the pad 50 is formed on the pad unit.

The semiconductor device embedded with pressure sensor according to this embodiment has five layer wirings (the first layer wiring 14 to the fifth layer wiring 22). However, the number of layers is not limited to five, but any number of wiring layers as required may be formed. Also, in the manufacturing method according to this embodiment, the CMP is applied to the silicon oxide film 11 and all interlayer insulating films 23 on the upper layers of the transistors (Qn, Qp, Qf). However, depending on the semiconductor device embedded with pressure sensor to be manufactured, the uppermost layer wiring (the fifth layer wiring 22) can be approximately planarized even if several CMP processes are omitted. Therefore, it is not always necessary to apply the CMP to all interlayer insulating films 23.

As described above, except for the CMP process for planarization, the embedding of a pressure sensor does not place any restrictions on the semiconductor device and the semiconductor device manufacturing method.

Figure 19:
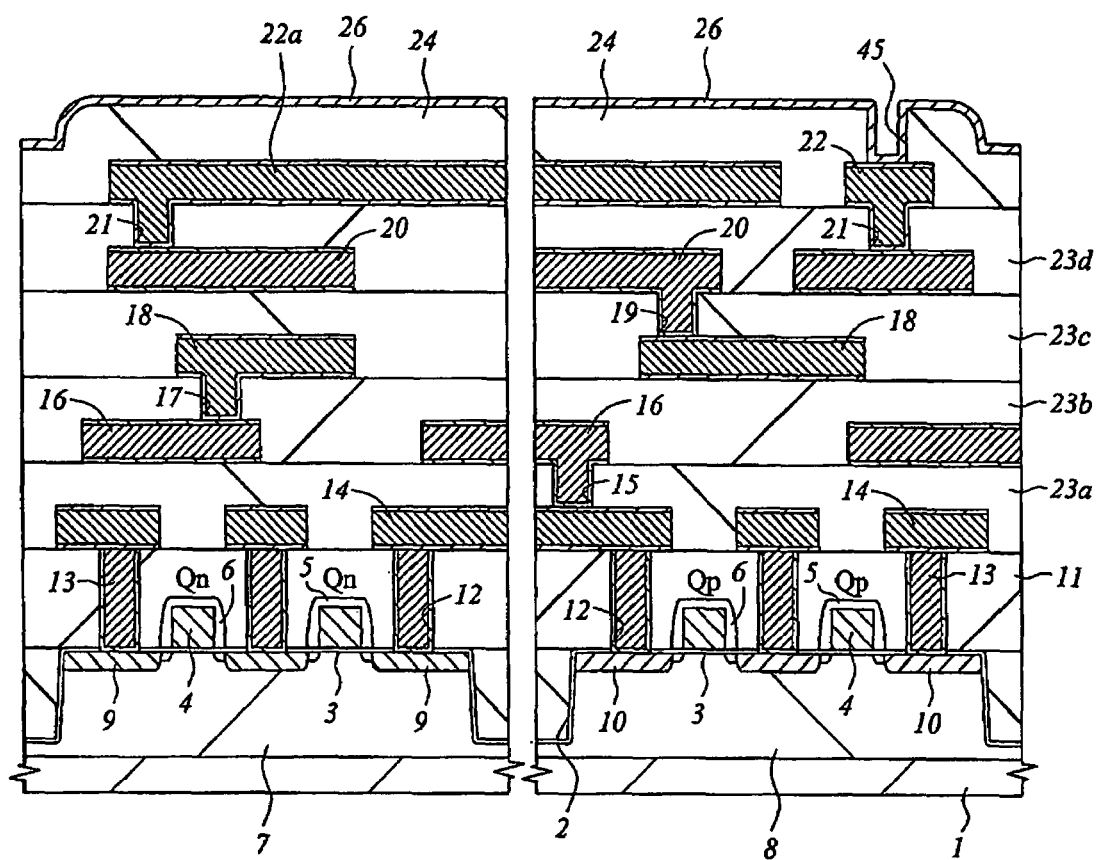
FIG. 19 is a section view showing the method of manufacturing a semiconductor device embedded with pressure sensor subsequent to FIG. 18.

Next, as shown in FIG. 19 (a section view of the pressure detecting unit), the silicon oxide film 24 having a thickness of 0.5 µm is formed on the upper layer of the lower electrode 22a, and the via hole 45 is formed in the silicon oxide film 24 by dry etching with using a photoresist film as a mask. Then, a tungsten silicide film 26 having a thickness of 200 nm, which is a part of the diaphragm, is formed on the silicon oxide film 24. The silicon oxide film 24 is formed by the plasma CVD with using TEOS and oxygen as source materials, and the tungsten silicide film 26 is formed by a sputtering method. When the tungsten silicide film 26 is formed, the composition of the sputter target is W:Si=1:2.8, but is not necessarily restricted to this composition. The flow rate of argon at the time of sputtering is adjusted so that the formed tungsten silicide film 26 has a tensile stress of about 200 MPa. Instead of adjusting the flow rate of argon, stress adjustment can also be carried out by, for example, adjusting a substrate temperature at the time of film formation. The tungsten silicide film 26 immediately after film formation is in a microcrystalline state close to the amorphous state, and crystals do not grow unless a heat treatment is applied. In the semiconductor device embedded with pressure sensor according to this embodiment, the tungsten silicide film 26 is used as a part of the diaphragm, but another material, for example, a tungsten film is also available. In the case of a tungsten film, the film is already in a column-shaped crystalline state immediately after film formation. Also in this case, the stress adjustment of the film can be carried out by adjusting the flow rate of argon or the substrate temperature at the time of film formation. Furthermore, although not used in this embodiment, in order to reduce the nonplanar topography, the SOG (Spin on Glass) film formed by the spin coating method can be formed on the silicon oxide film 24, and then, the tungsten silicide film 26 can be formed on the formed film.

Figure 20:
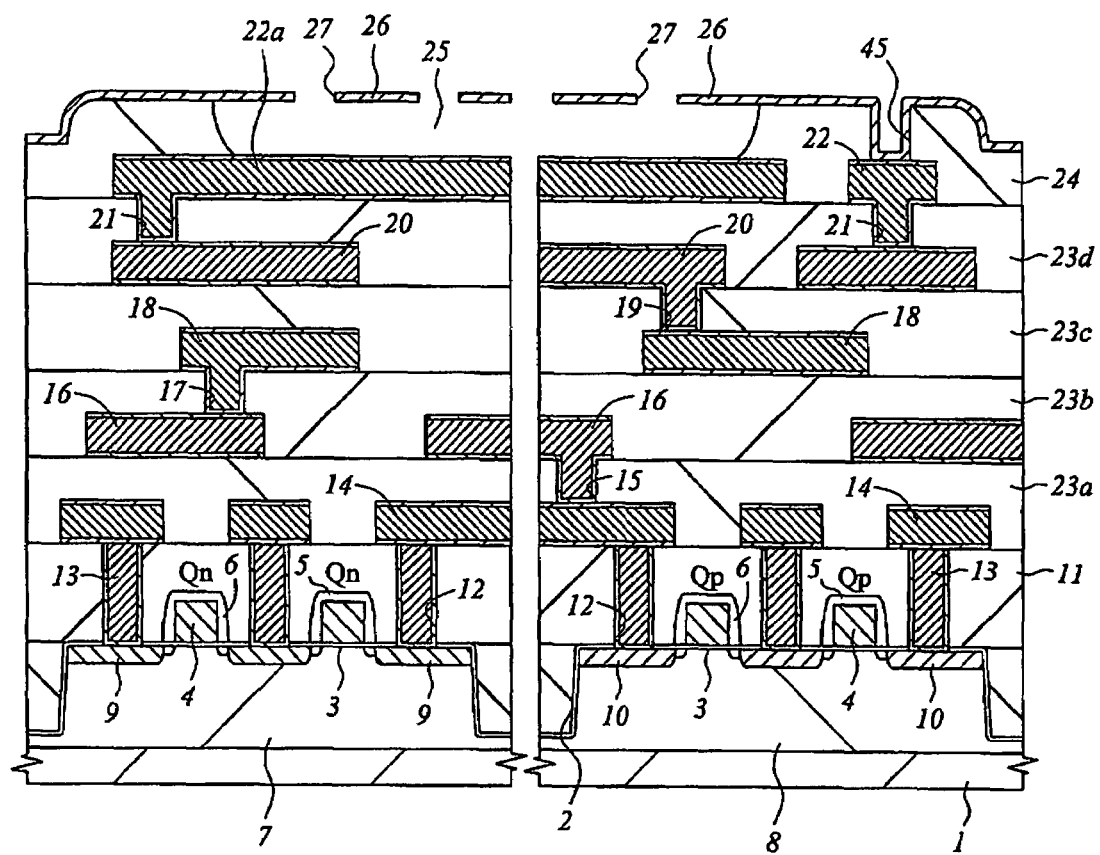
FIG. 20 is a section view showing the method of manufacturing a semiconductor device embedded with pressure sensor subsequent to FIG. 19.

Next, as shown in FIG. 20 (a section view of the pressure detecting unit), many holes 27 are formed in the tungsten silicide film 26 by dry etching with using a photoresist film as a mask. A lithography apparatus for use at this time is an i-line stepper, and each hole 27 has a diameter of 0.25 μm. When forming the hole 27, a hole having a diameter of 0.45 μm is first opened in the tungsten silicide film 26 through exposure using an i-line photoresist film, and then, the photoresist film is softened by heating that is a known thermal flow technology. By doing so, the hole diameter is reduced. Next, the tungsten silicide film 26 is dry etched with using the photoresist film having this hole with reduced diameter to form the hole 27.

Next, after the photoresist film is removed, the silicon substrate 1 is immersed in hydrofluoric acid to remove a part of the silicon oxide film 24 with the hydrofluoric acid coming through the hole 27. By doing so, the cavity 25 is formed between the tungsten silicide film 26 to be a part of the diaphragm and the lower electrode 22a. After the etching for a predetermined time, the etching is stopped by means of the water rinse, and then, the silicon substrate 1 is dried. The shape of the cavity 25 viewed from the top is a circle having a diameter of approximately 30 μm. Since the lower electrode 22a (the fifth layer wiring 22) has the uppermost layer formed of a titanium nitride film, when the cavity 25 is formed in a part of the silicon oxide film 24, the lower electrode 22a is not etched by hydrofluoric acid.

As described above, the tungsten silicide film 26 has a tensile stress. This can prevent the so-called sticking, which is a phenomenon in which the tungsten silicide film 26 is stuck to the lower electrode 22a by a surface tension of water at the time of drying after water rinse. The reduction of the size of the capacitor or spacing the lower electrode and the diaphragm apart from each other may be effective for the prevention of the sticking. However, there is a problem that the capacitance of the capacitor is reduced. In the capacitor according to this embodiment, the sticking does not occur.

Figure 21:
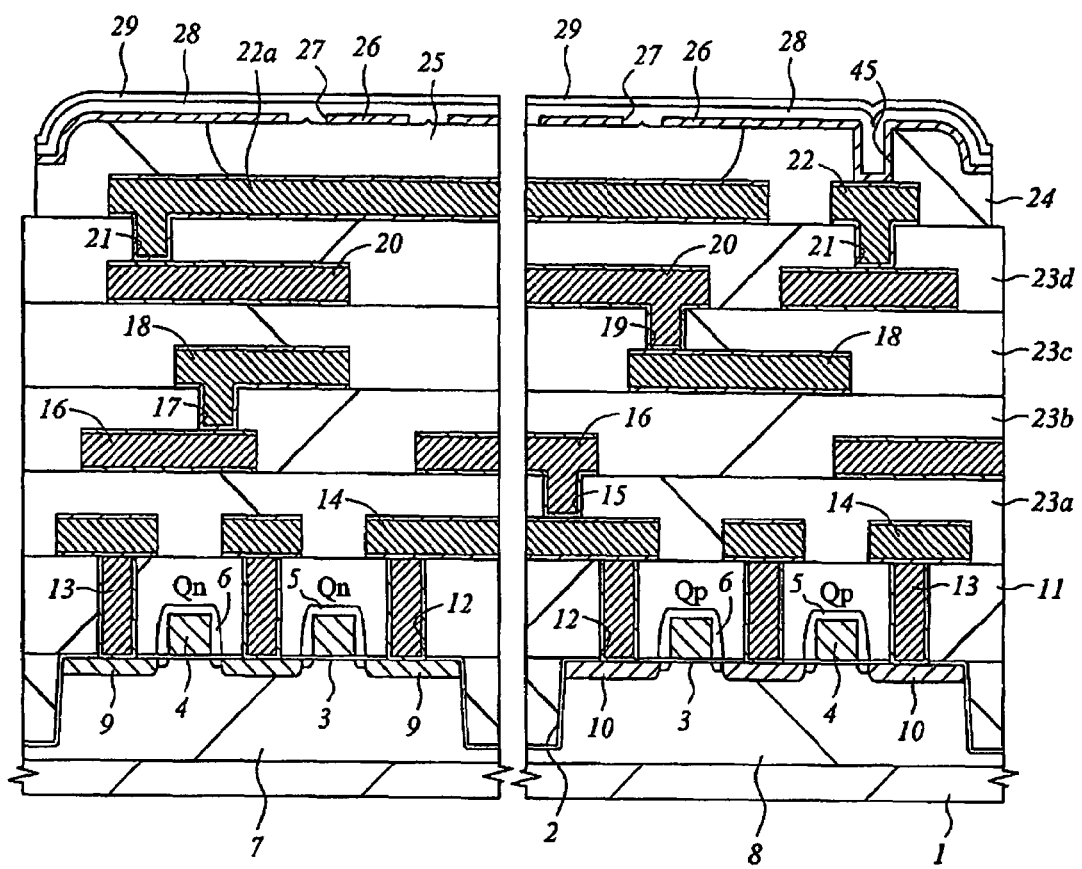
FIG. 21 is a section view showing the method of manufacturing a semiconductor device embedded with pressure sensor subsequent to FIG. 20.

Next, as shown in FIG. 21 (a section view of the pressure detecting unit), the silicon nitride film 28 is deposited on the tungsten silicide film 26, and the silicon oxide film 29 is formed on the silicon nitride film 28 by the plasma CVD with using TEOS and oxygen as source materials. When the silicon nitride film 28 is deposited, the hole 27 formed in the tungsten silicide film 26 is filled by the silicon nitride film 28. This is an effect achieved by the fact that the diameter of the hole 27 is reduced to 0.25 μm by using the technology of a resist thermal flow. Note that, in this embodiment, the hole 27 is filled by the silicon nitride film 28 by the plasma CVD. The hole 27 can be filled by using another film, for example, a silicon oxide film formed by the atmospheric pressure CVD with using TEOS and ozone as source materials or a silicon oxide film formed by the plasma CVD using high-density plasma. When the silicon nitride film 28 is deposited by the plasma CVD, the pressure inside the cavity 25 formed between the tungsten silicide film 26 and the lower electrode 22a is reduced to be vacuum. When deposited by the atmospheric pressure CVD, the cavity is filled with gas containing nitrogen and the like as the main components at atmospheric pressure.

Next, the silicon oxide film 29, the silicon nitride film 28, the tungsten silicide film 26, and the silicon oxide film 24 are patterned by dry etching with using a photoresist film as a mask so that these films are left only on the pressure detecting unit. The pattern of these films left on the pressure detecting unit viewed from the top is a circle having a diameter of 45 μm. Note that, in the circuit of the pressure detecting unit according to this embodiment, nine capacitors are connected in parallel to achieve a large capacitance for highly accurate measurement.

Figure 22:
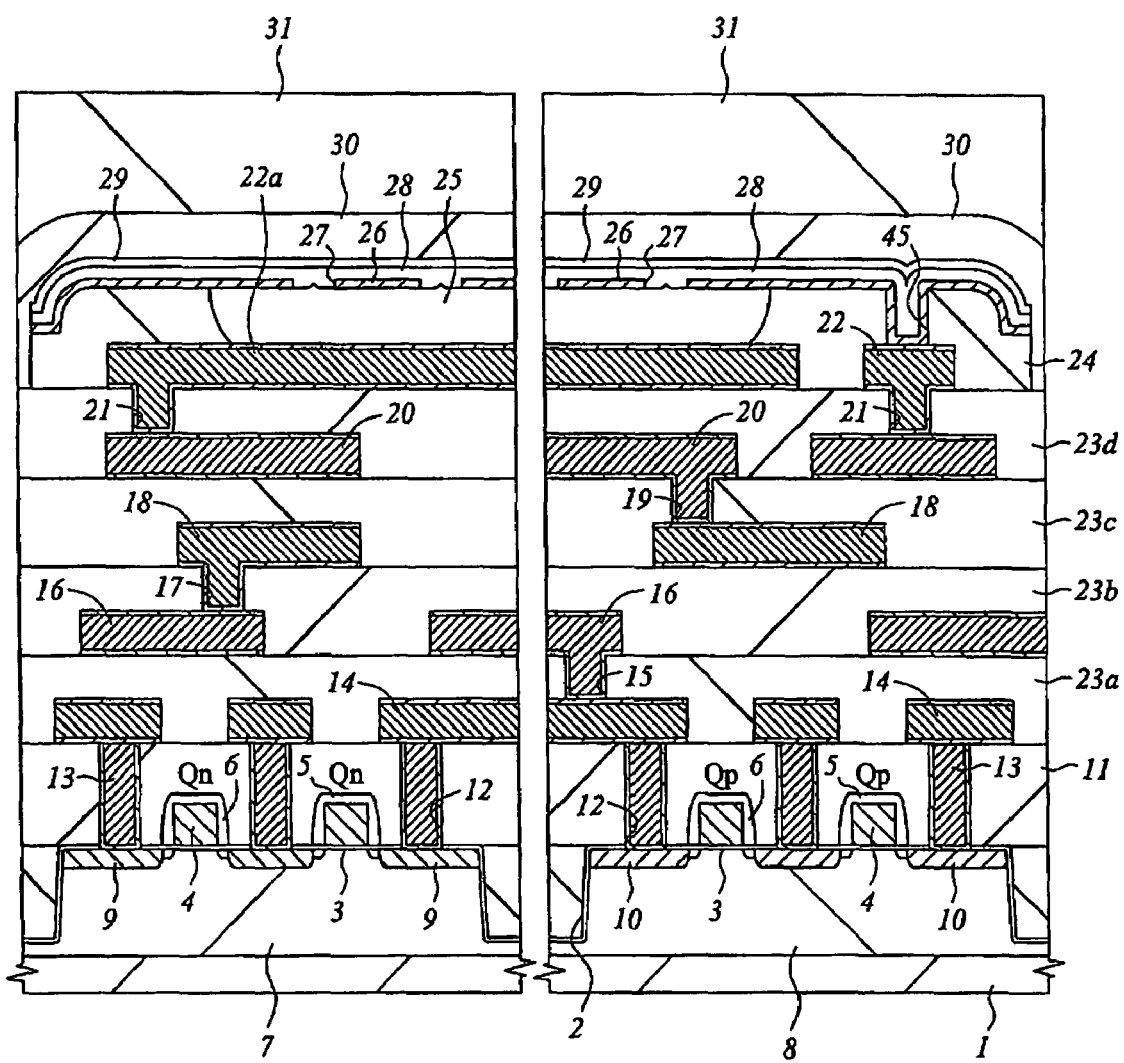
FIG. 22 is a section view showing the method of manufacturing a semiconductor device embedded with pressure sensor subsequent to FIG. 21.

Next, as shown in FIG. 22 (a section view of the pressure detecting unit), after the silicon nitride film 30 is deposited on the silicon substrate 1 by the plasma CVD, the photosensitive polyimide film 31 is formed on the silicon nitride film 30 by the spin coating method.

Figure 23:
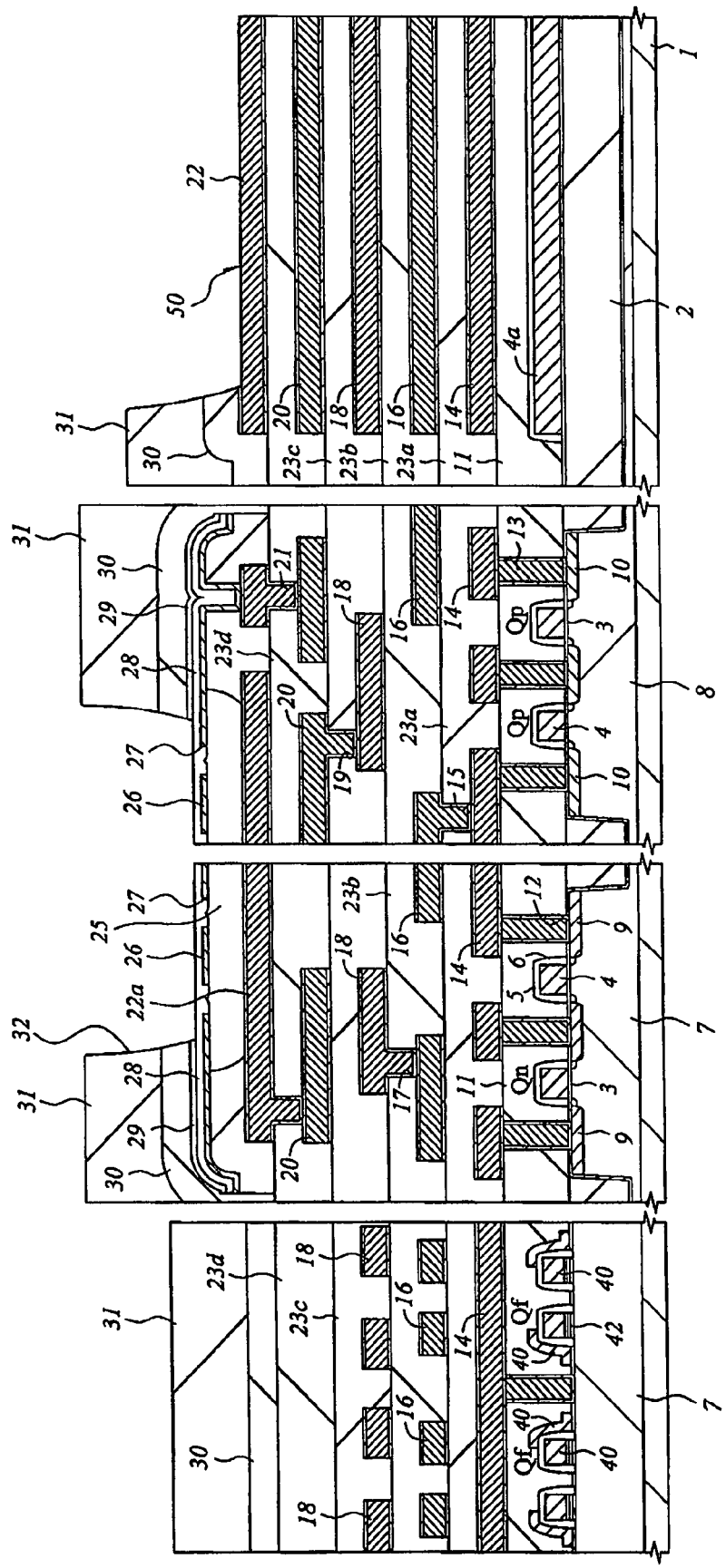
FIG. 23 is a section view showing the method of manufacturing a semiconductor device embedded with pressure sensor subsequent to FIG. 22.

Next, as shown in FIG. 23 (a section view of the pressure detecting unit), after the photosensitive polyimide film 31 on the diaphragm is exposed and developed for removal, the silicon nitride film 30 and the silicon oxide film 29 on the diaphragm are etched with using this photosensitive polyimide film 31 as a mask. By doing so, the hole 32 is formed on the diaphragm. At this time, the photosensitive polyimide film 31 and the silicon nitride film 30 on the pad 50 are also etched to expose the pad 50. As shown in FIG. 2 described above, the photosensitive polyimide film 31, the silicon nitride film 30, and the silicon oxide film 29 on the diaphragm of the reference capacitor unit are not etched. Basically, this is the only point that is different from the method of manufacturing a pressure detecting unit. Similar to the capacitors of the pressure detecting unit, nine capacitors are connected in parallel to achieve a large capacitance also in the reference capacitor unit.

Through the processes described above, the semiconductor device embedded with pressure sensor according to this embodiment shown in FIG. 1 to FIG. 5 is obtained.

Figure 24:
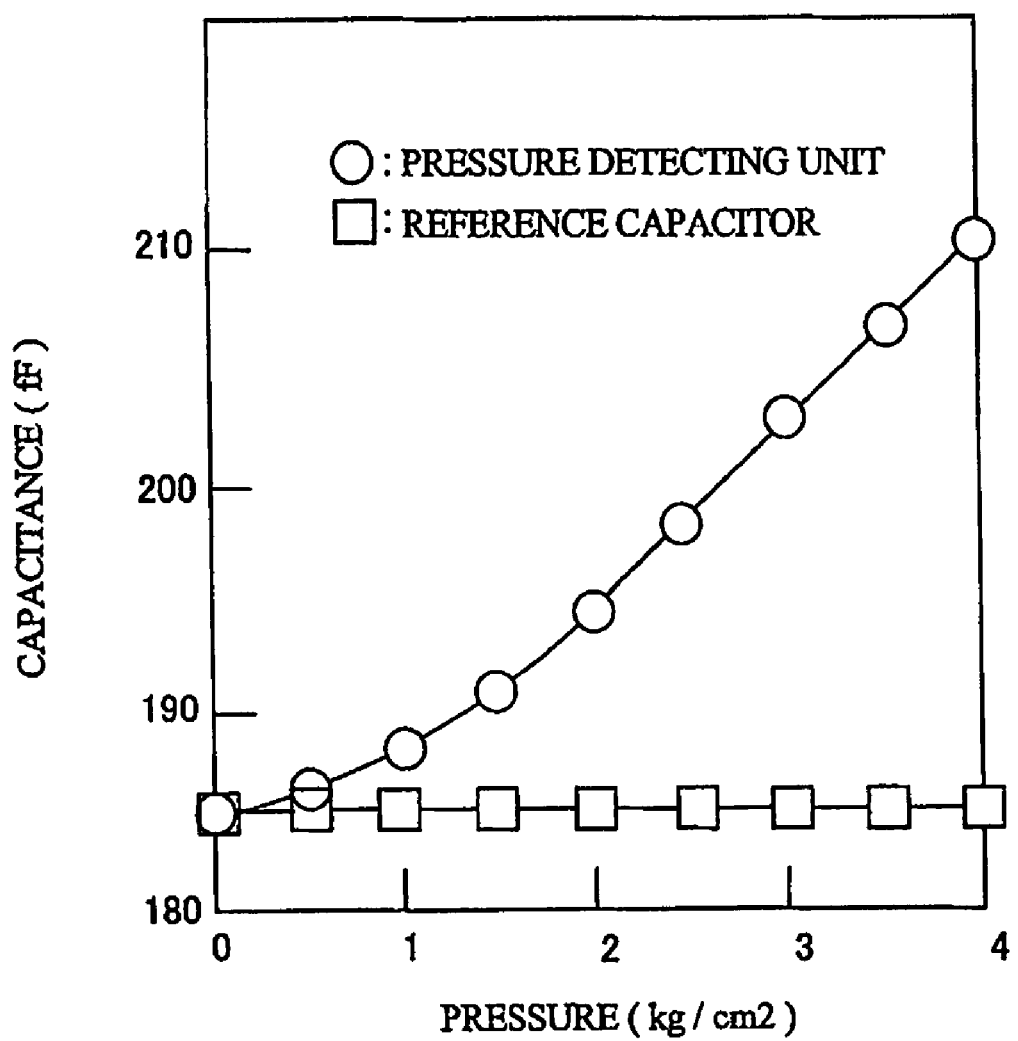
FIG. 24 is a graph showing a pressure-capacitance characteristic of the semiconductor device embedded with pressure sensor according to an embodiment of the present invention.

The operational characteristics of the semiconductor device embedded with pressure sensor manufactured in the above-described manner is measured and evaluated. As a result of high-frequency measurement of 100 kHz, the capacitance in atmospheric pressure is 184.5 fF as shown in FIG. 24. This value is obtained when nine capacitors with the diameter of a fixed electrode of 37 μm are connected in parallel.

Next, when the capacitance is measured while changing the applied pressure, the value is changed as shown in FIG. 24. For example, a capacitance value of 202.5 fF is obtained at the pressure of 3 kg/cm$^2$. In addition, when deformation of the diaphragm at the pressure of 3 kg/cm$^2$ is examined, it is found that the diaphragm is dented by approximately 0.15 μm at the center portion of the capacitor. That is, as a result of the reduction in distance to the fixed electrode by 0.15 μm, the capacitance is increased from 184.5 fF to 202.5 fF. Similarly, when the capacitance of the reference capacitor is examined, the capacitance in atmospheric pressure is 184.7 fF. It is found that this value is not changed even when pressure is applied, and represents that the performance required for the reference capacitor is provided. Note that one information that cannot be obtained only by the comparison with the reference capacitor is temperature. In the semiconductor device embedded with pressure sensor according to this embodiment, however, temperature is obtained from the temperature sensor described above to correct the pressure based on the temperature.

Figure 25:
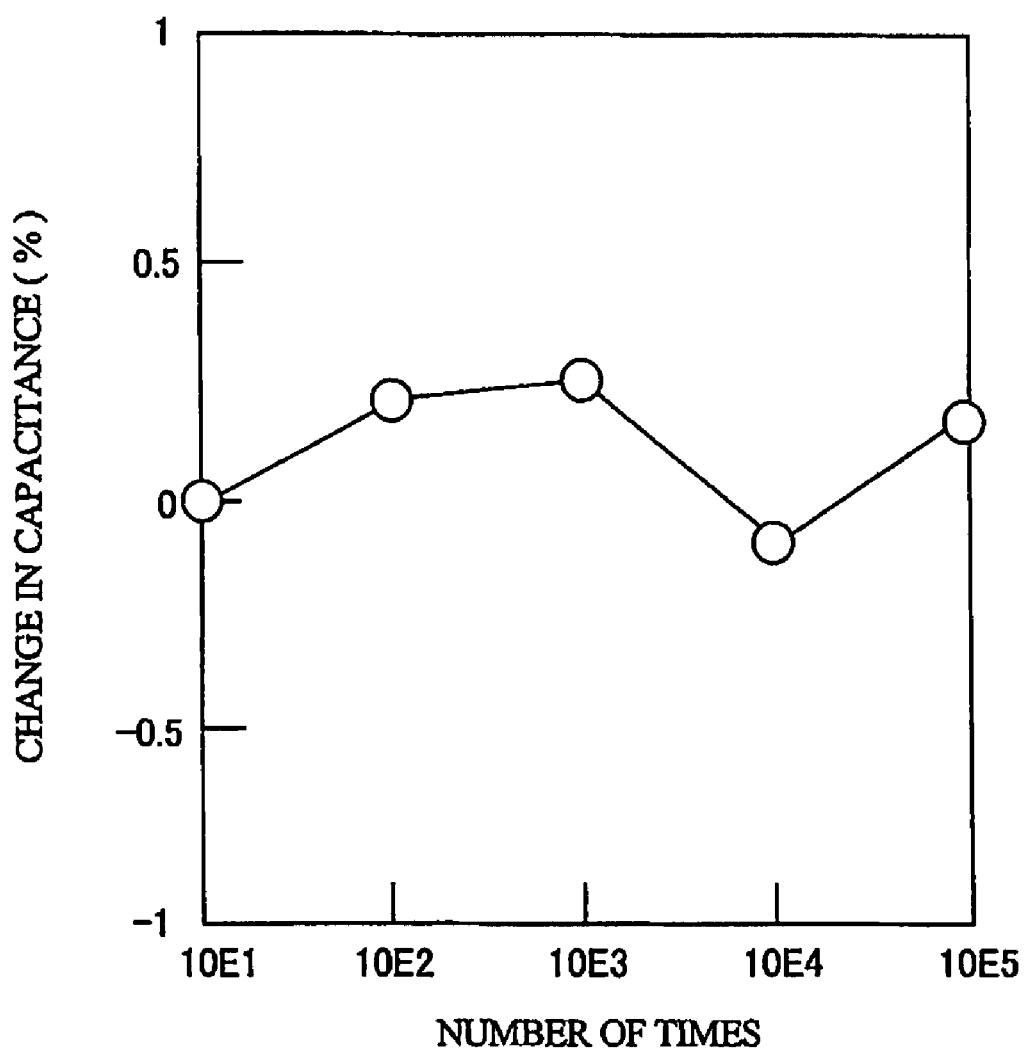
FIG. 25 is a graph showing the characteristic between the number of times of pressuring and capacitance change of the semiconductor device embedded with pressure sensor according to an embodiment of the present invention.

Next, a reliability evaluating test is performed. Atmospheric pressure and a pressurized state of 4 kg/cm$^2$ are repeated a large number of times, and then the capacitance at atmospheric pressure is measured. The results obtained by the pressure detecting unit are shown in FIG. 25. As a result of the measurement up to 100,000 times of repetition of pressurization, the value of the capacitance is within the range of ±0.25%, and an increasing tendency or decreasing tendency due to the repetition of pressurization is not shown. Therefore, the difference can be considered to be the margin of error including that of the measuring system.

Figure 26:
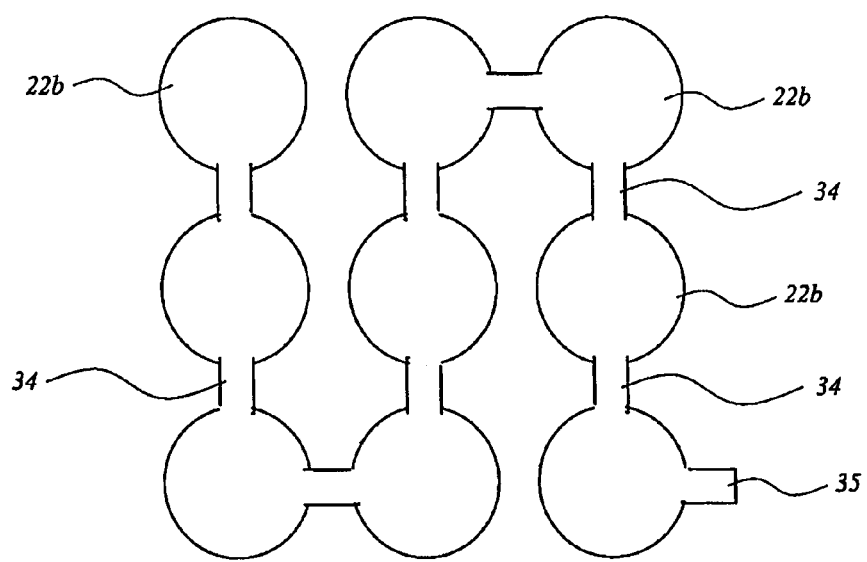
FIG. 26 is a plan view showing a layout of an uppermost layer wiring of the semiconductor device embedded with pressure sensor according to an embodiment of the present invention.

Next, a layout of the uppermost layer wiring will be described with reference to FIG. 26 to FIG. 28. In this embodiment, the fifth layer wiring is the uppermost layer wiring. However, depending on the semiconductor device to be embedded with a pressure sensor, another wiring layer may be the uppermost layer wiring. FIG. 26 is a drawing showing a layout of the pressure detecting unit. Each circular portion corresponds to a lower electrode 22b, and its diameter is 37 μm. The lower electrodes 22b are electrically connected to each other by connecting portions 34. The wiring is electrically connected from its end portion 35 to a lower layer wiring via a via hole (not shown). This drawing shows a layout of the pressure detecting unit, which is exactly the same as a layout of the reference capacitor unit. Therefore, the parasitic capacitance of the connecting portions 34 or the like of the pressure detecting unit is also equivalent to that of the reference capacitor unit.

Figure 27:
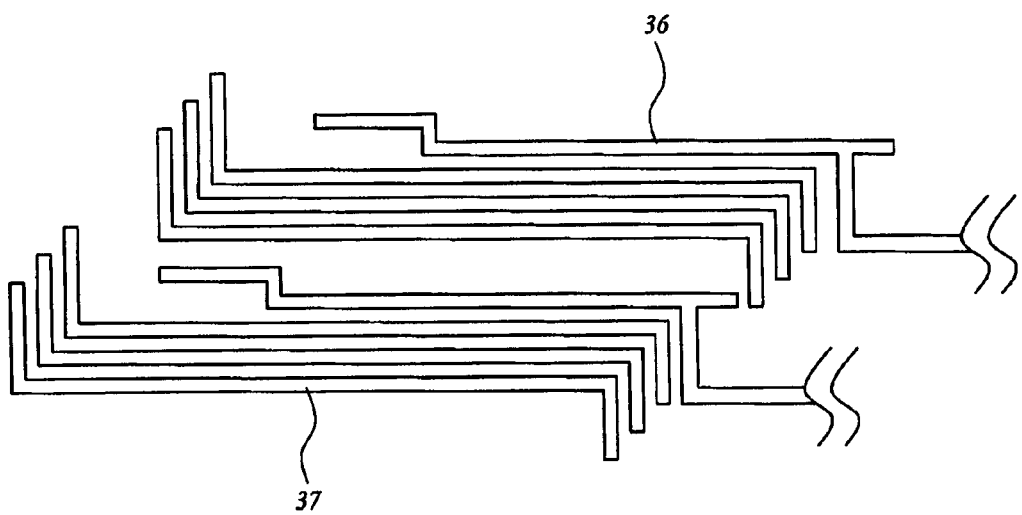
FIG. 27 is another plan view showing the layout of the uppermost layer wiring of the semiconductor device embedded with pressure sensor according to an embodiment of the present invention.
Figure 28:
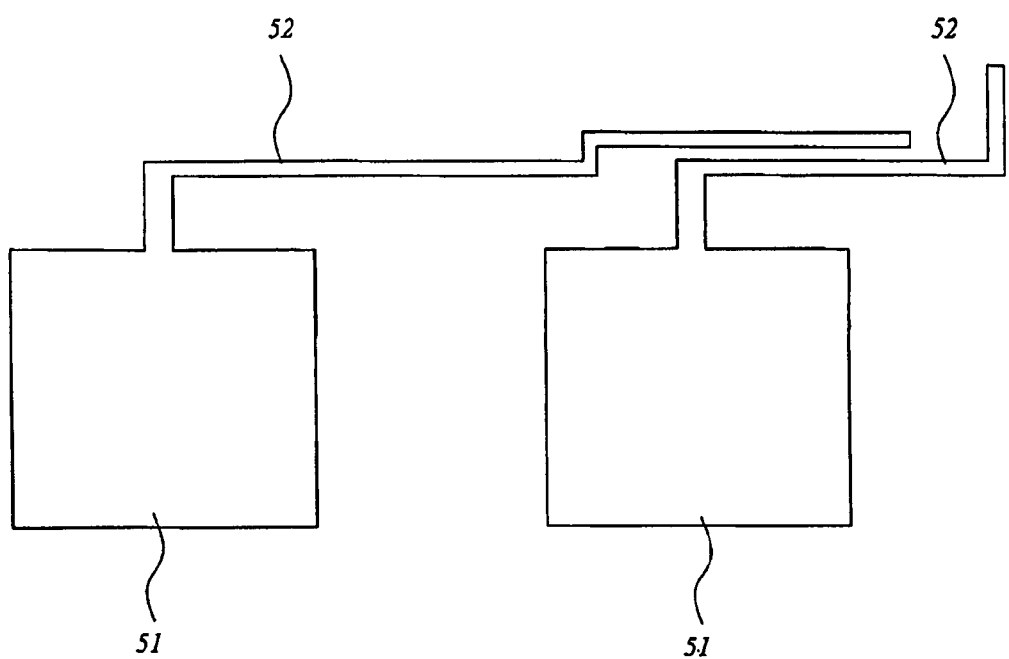
FIG. 28 is still another plan view showing the layout of the uppermost layer wiring of the semiconductor device embedded with pressure sensor according to an embodiment of the present invention.

FIG. 27 is a drawing showing a layout of the CMOS circuit unit, in which power supply wirings 36 and 37 and others are disposed. The wiring width of each of the power supply wirings 36 and 37 at this portion is 3 μm. FIG. 28 is a drawing showing a layout of the pad portion. The pad 51 has a square shape with each side of 70 μm and is connected to the CMOS circuit unit and others via lead wirings 52. Note that, in many flash memory circuit units, the uppermost layer wiring is not used as described above.

As has been described in detail, according to this embodiment, a semiconductor device can be formed on a layer located lower than the pressure detecting unit. Therefore, it is possible to reduce the chip area of the semiconductor device embedded with pressure sensor. Other than the application and change of a planarization process such as CMP to be performed as required, no influence is exerted on semiconductor devices located lower than the pressure detecting unit. Therefore, no restriction occurs on the manufacturing method of a semiconductor device. Consequently, it is possible to embed a highly-microfabricated high-performance semiconductor device together with a pressure sensor, and the low power consumption can be achieved. Furthermore, since the pressure detecting unit is formed on an upper layer of a semiconductor device, and the semiconductor device is protected by a nitride film and a polyimide film, it is possible to simplify the packaging more than that of the conventional technologies.

Second Embodiment

In the second embodiment, the present invention is applied to a semiconductor device embedded with pressure sensor in which a digital circuit, an analog circuit such as an amplifier for amplifying a sensor signal and a wireless transceiver circuit, a flash memory circuit of a MONOS type, a capacitive pressure sensor and the like are embedded together on one chip.

Figure 29:
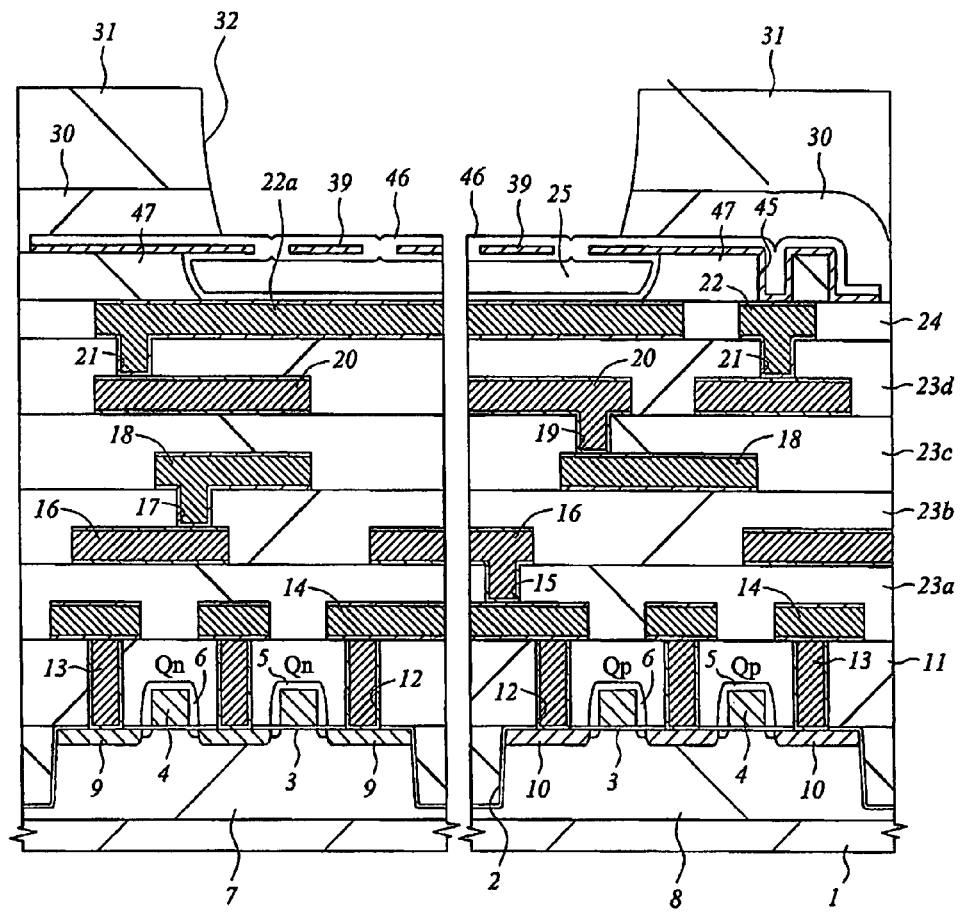
FIG. 29 is a section view of main components including a pressure detecting unit of a semiconductor device embedded with pressure sensor according to another embodiment of the present invention.

As shown in FIG. 29, the silicon oxide film 24 on the fifth layer wiring 22, which is the uppermost layer wiring, and the lower electrode 22a is planarized by CMP so as to have a height equal to that of the fifth layer wiring 22 and the lower electrode 22a. On the upper portion of the silicon oxide film 24, the fifth layer wiring 22, and the lower electrode 22a, a silicon oxide film 47 is formed, and the diaphragm is formed thereon. The cavity 25 under the diaphragm is filled with gas containing nitrogen as the main component at atmospheric pressure, and a silicon dioxide film 46 is formed on the inner wall thereof. A metal film to be a part of the diaphragm is a tungsten film 39, and its surface is oxidized. Furthermore, a film on a layer upper than the tungsten film 39 is the silicon oxide film 46, and the silicon nitride film 30 and the photosensitive polyimide film 31 are formed on the upper portion thereof. The pressure detecting unit according to this embodiment has the structure excellent in flatness when compared with the pressure detecting unit according to the above-described first embodiment.

Next, a method of manufacturing the semiconductor device embedded with pressure sensor according to this embodiment will be described with reference to FIG. 30 to FIG. 32.

Figure 30:
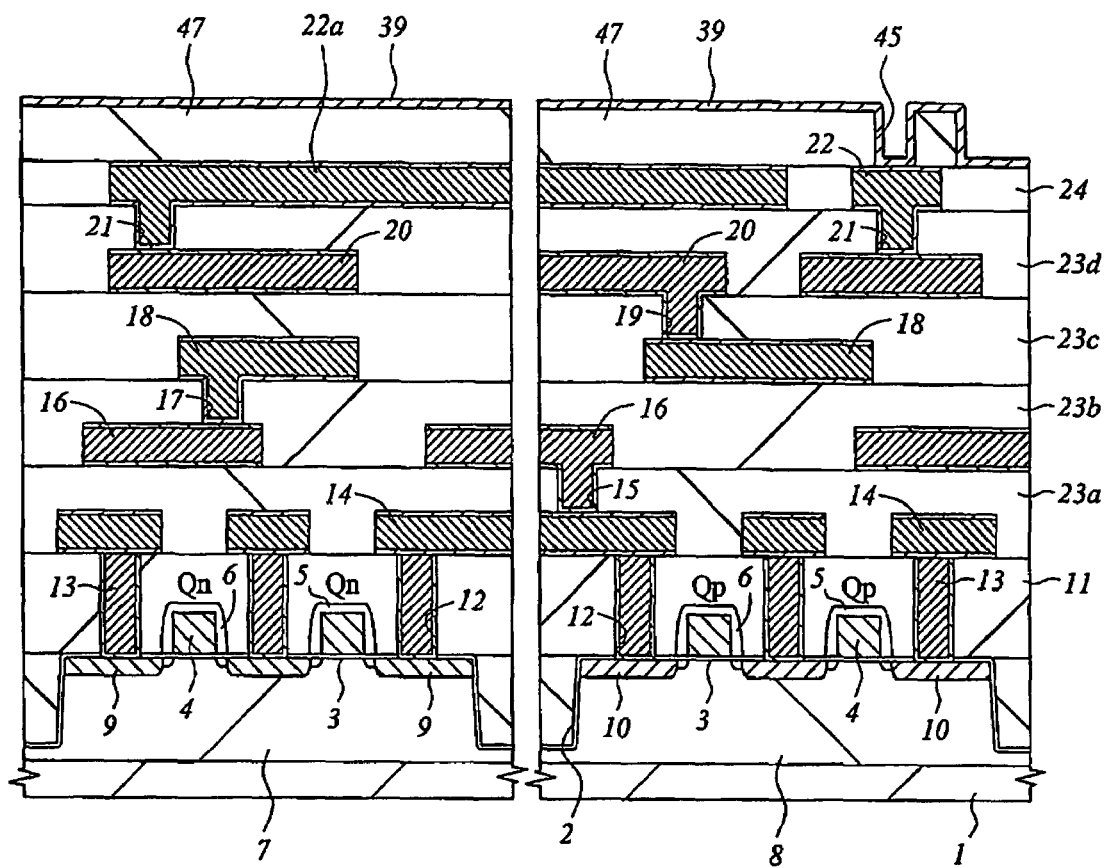
FIG. 30 is a section view showing a method of manufacturing a semiconductor device embedded with pressure sensor according to still another embodiment of the present invention.

First, as shown in FIG. 30, after the first layer wiring 14 to the fifth layer wiring 22 and the lower electrode 22a are formed on the silicon substrate 1 in the same manner as that of the first embodiment, the silicon oxide film 24 having a thickness of 3 μm is deposited on the upper layer of the fifth layer wiring 22 and the lower electrode 22a by the plasma CVD using high-density plasma. Subsequently, the silicon oxide film 24 is polished by a CMP. By doing so, the surfaces of the fifth layer wiring 22 and the lower electrode 22a are exposed. Then, a silicon oxide film 47 is deposited on the upper portion of the silicon oxide film 24, the fifth layer wiring 22, and the lower electrode 22a by the CVD.

In view of the local distribution of CMP polishing speeds, it is desirable that the titanium nitride film of the fifth layer wiring 22 and the lower electrode 22a is made in advance thicker than normal (for example, 0.25 μm). Next, after the via hole 45 is formed in the silicon oxide film 24, the tungsten film 39 having a thickness of 200 nm is deposited on the silicon oxide film 24 by the plasma CVD with using TEOS and oxygen as source materials. Similar to the tungsten silicide film in the above-described first embodiment, film formation conditions are defined so that the tungsten film 39 has a tensile stress.

Figure 31:
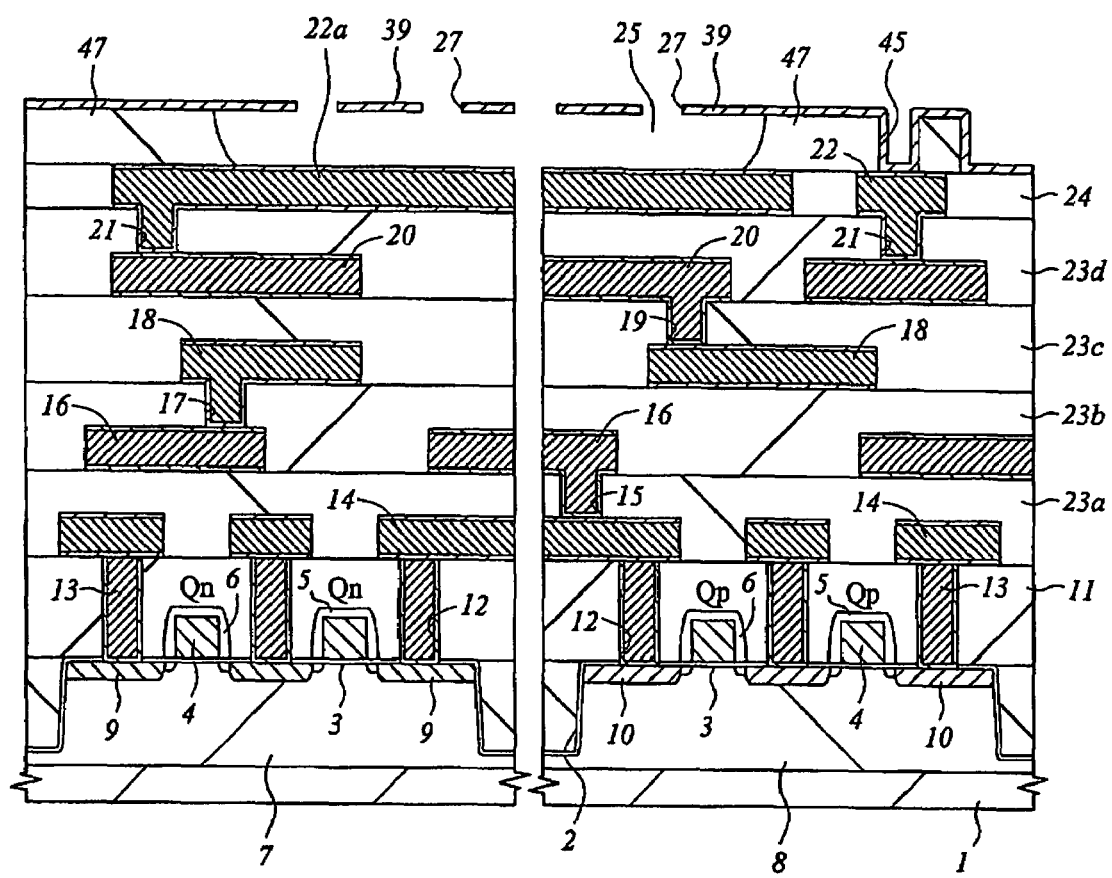
FIG. 31 is a section view showing the method of manufacturing a semiconductor device embedded with pressure sensor subsequent to FIG. 30.

Next, as shown in FIG. 31, by a lithography technology using an electron-beam lithography apparatus and well-known dry etching technology, many holes 27 each having a diameter of 0.2 μm are formed in the tungsten film 39. Similar to the above-described first embodiment, the holes 27 may be formed with the concurrent use of the i-line lithography technology and the resist thermal flow technology, and their diameter is desirably reduced to be about 0.3 μm or smaller. Also, according to need, a pattern may be once transferred from a resist to a hard mask, and then the holes 27 may be formed in the tungsten film 39 using the hard mask. When a silicon oxide film is used as the hard mask, the hard mask is simultaneously removed at the time of forming the cavity 25 with using hydrofluoric acid at the next process, which is advantageous.

Next, by the etching using hydrofluoric acid, the cavity 25 is formed in the silicon oxide film 47. Similar to the above-described first embodiment, etching is performed with the tungsten film 39 left on the front surface of the silicon substrate 1 instead of performing the etching by hydrofluoric acid with using a photoresist film as a mask. This is because resistance of the photoresist film to hydrofluoric acid is taken into consideration. If the photoresist with high resistance is used, it is also possible to process the tungsten film 39 in advance. Similar to the above-described first embodiment, also in this embodiment, the sticking does not occur in the course of water rinse and drying after the etching owing to the effect of the tungsten film 39 having a tensile stress.

Figure 32:
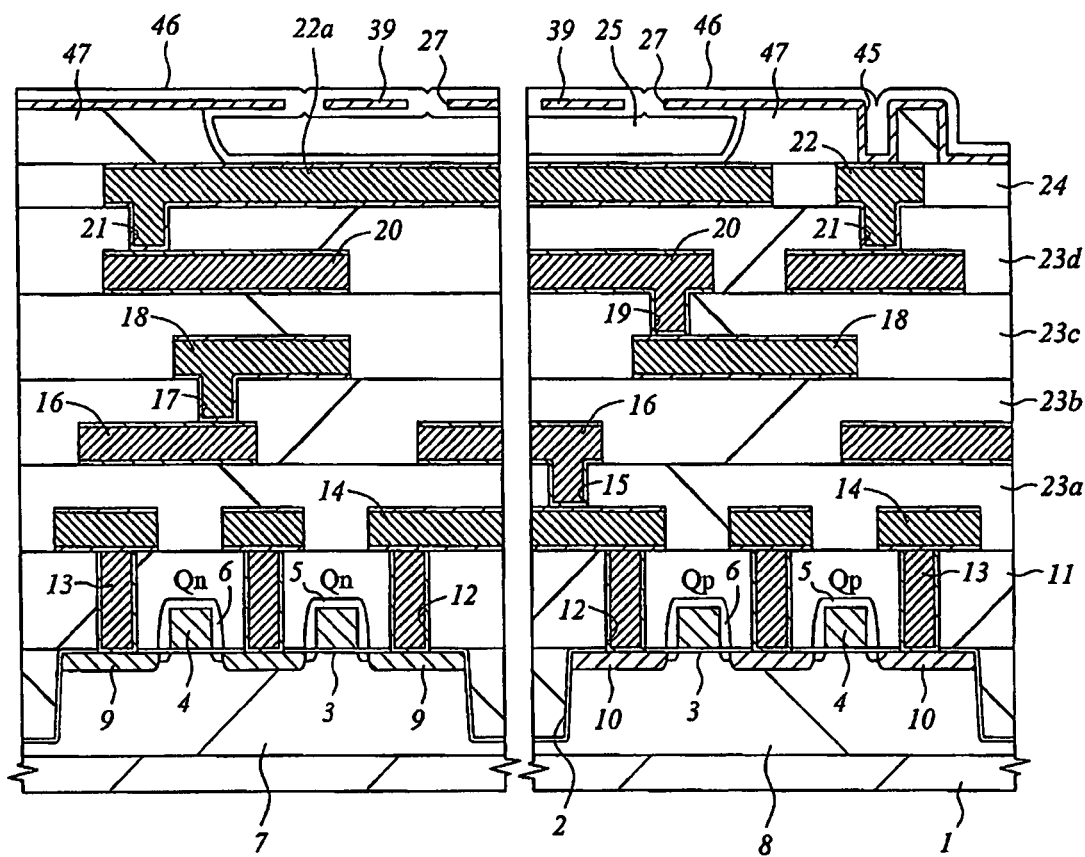
FIG. 32 is a section view showing the method of manufacturing a semiconductor device embedded with pressure sensor subsequent to FIG. 31.

Next, as shown in FIG. 32, the silicon oxide film 46 having a thickness of 200 nm is deposited by the atmospheric pressure CVD with using TEOS and ozone as source materials. In an early stage of depositing this silicon oxide film 46, an exposed portion of the tungsten film 39 is oxidized, and the anti-corrosion characteristic thereof is improved. Also, when the silicon oxide film 46 is deposited, since the atmospheric pressure CVD with using TEOS and ozone as source materials is used, the silicon oxide film 46 is formed even on the inner wall of the cavity 25. The silicon oxide film 46 on the inner wall of the cavity 25 has an effect to prevent the tungsten film 39 of the diaphragm and the lower electrode 22a from being short-circuited when an excessive pressure is applied to the pressure detecting unit. Furthermore, since the silicon oxide film 46 is formed by the atmospheric pressure CVD, the inside of the cavity 25 is filled with gas containing nitrogen as the main component at atmospheric pressure. The processes thereafter are identical to those in the above-described first embodiment. In the foregoing, the method of manufacturing the pressure detecting unit has been described. Also, the reference capacitor is manufactured in an almost the same manner.

Many semiconductor devices embedded with pressure sensor according to this embodiment are manufactured, and their characteristics are measured. As a result, variation in capacitance value under atmospheric pressure is smaller than that in the above-described first embodiment. This is because, since the silicon oxide film 24 on the upper layer of the fifth layer wiring 22 and the lower electrode 22a is planarized, the processing accuracy in the following diaphragm formation is improved. The other characteristics are similar to those in the above-described first embodiment.

Third Embodiment

In the third embodiment, the present invention is applied to a semiconductor device embedded with pressure sensor in which a digital circuit, an analog circuit such as an amplifier for amplifying a sensor signal and a wireless transceiver circuit, an EEPROM circuit, a capacitive pressure sensor and the like are embedded together on one chip.

Figure 33:
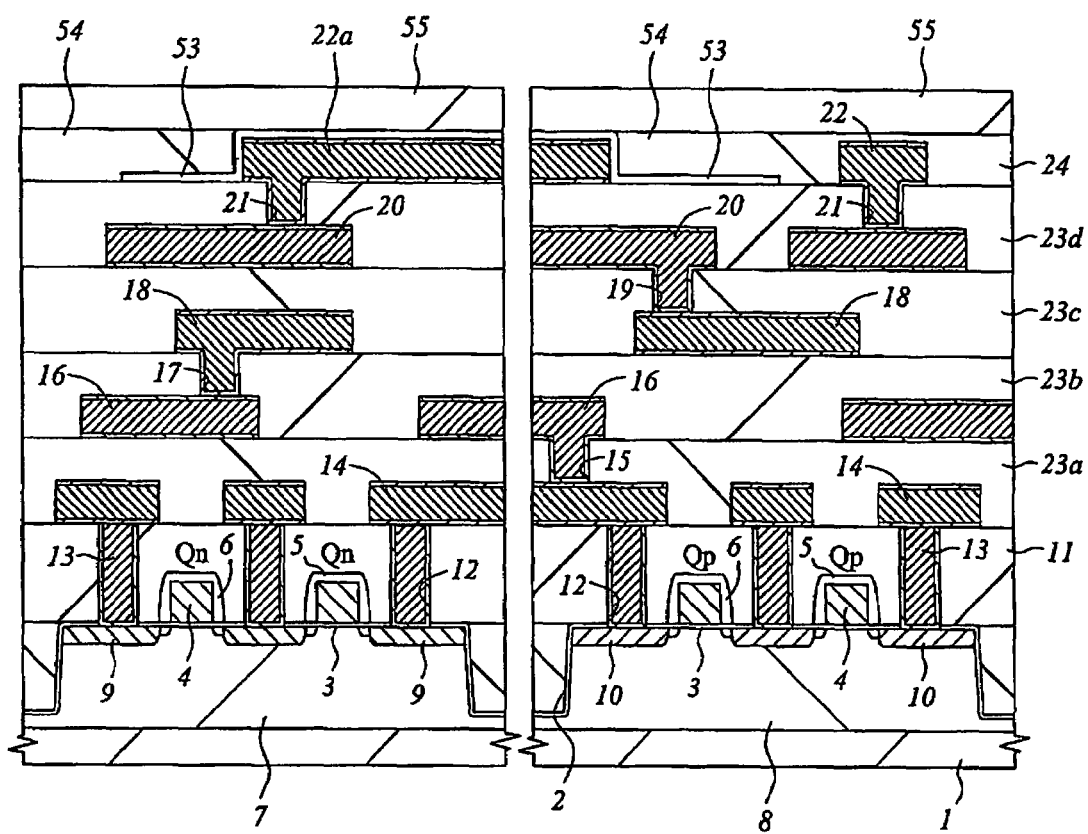
FIG. 33 is a section view showing a method of manufacturing a semiconductor device embedded with pressure sensor according to still another embodiment of the present invention.

A method of manufacturing a pressure detecting unit according to this embodiment will be described with reference to FIG. 33 to FIG. 37. First, the first layer wiring 14 to the fifth layer wiring 22 and the lower electrode 22a are formed on the silicon substrate 1 in the same manner as that of the above-described first embodiment, and then, as shown in FIG. 33, a silicon nitride film 53 on the silicon substrate 1 is patterned so that the patterned silicon nitride film 53 is left on the upper portion and the periphery of the lower electrode 22a. Then, a silicon oxide film 54 is deposited on the silicon substrate 1, and the surface of the deposited film is planarized by a CMP. Thereafter, a silicon oxide film 55 is formed on the upper portion of the silicon oxide film 54.

Figure 34:
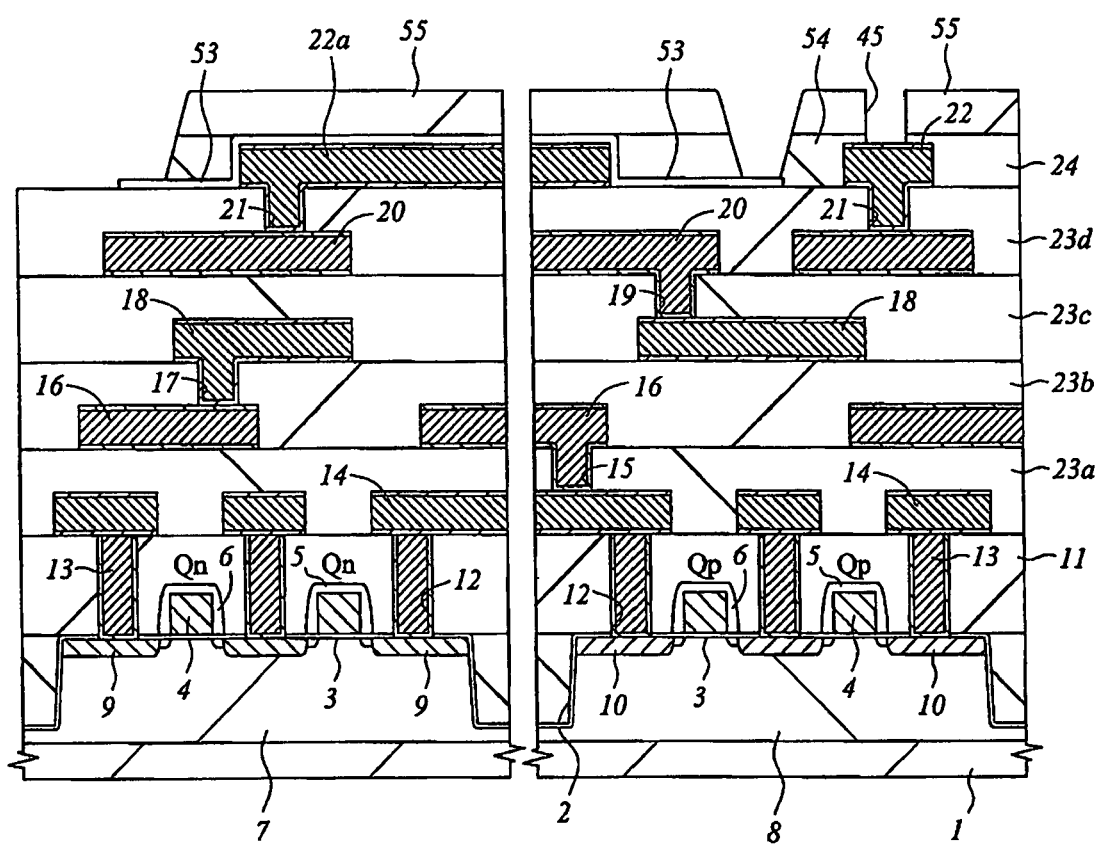
FIG. 34 is a section view showing the method of manufacturing a semiconductor device embedded with pressure sensor subsequent to FIG. 33.

Next, as shown in FIG. 34, the silicon oxide films 54 and 55 in the periphery of the lower electrode 22a are removed by dry etching with using a photoresist film as a mask. At this time, the via hole 45 is formed on the upper portion of the fifth layer wiring 22.

Figure 35:
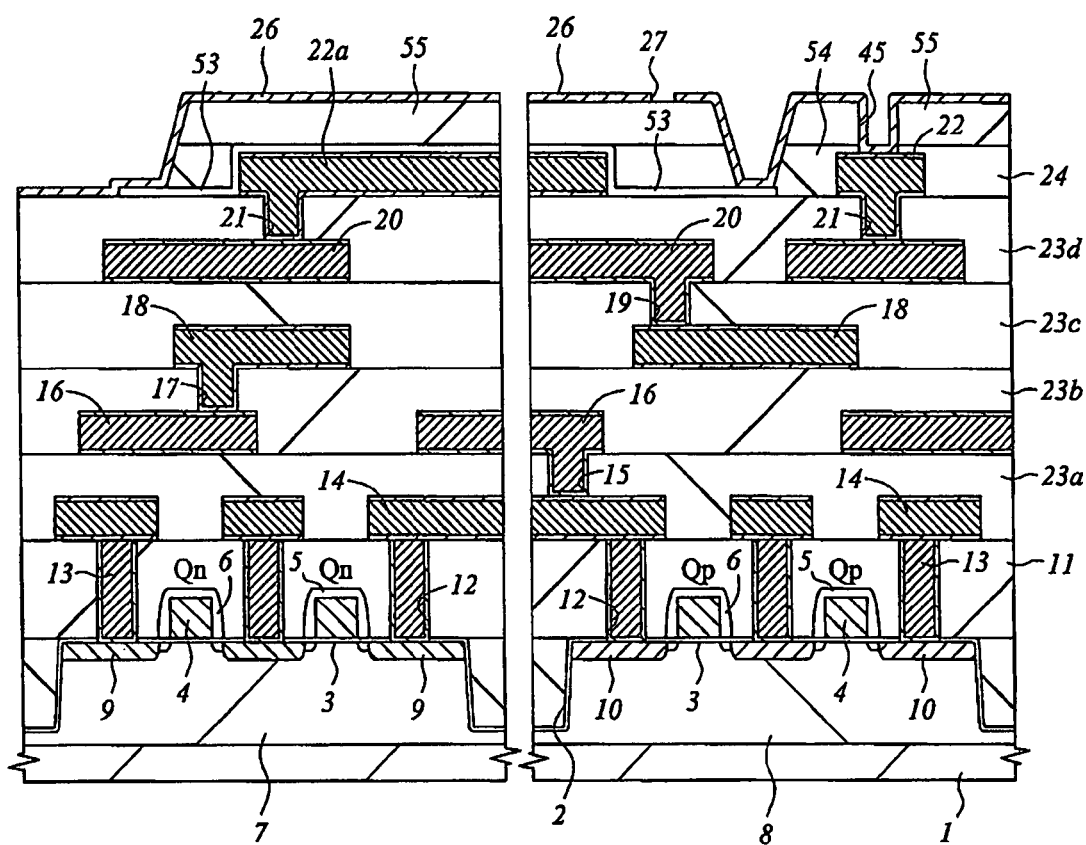
FIG. 35 is a section view showing the method of manufacturing a semiconductor device embedded with pressure sensor subsequent to FIG. 34.

Next, as shown in FIG. 35, the tungsten silicide film 26, which is a part of the diaphragm, is deposited by the sputtering method. At this time, the substrate temperature is set at about 300° C. so as to make the tungsten silicide film 26 have a tensile stress of about 250 MPa. Then, the hole 27 is formed in a part of the tungsten silicide film 26 by dry etching with using a photoresist film as a mask.

Figure 36:
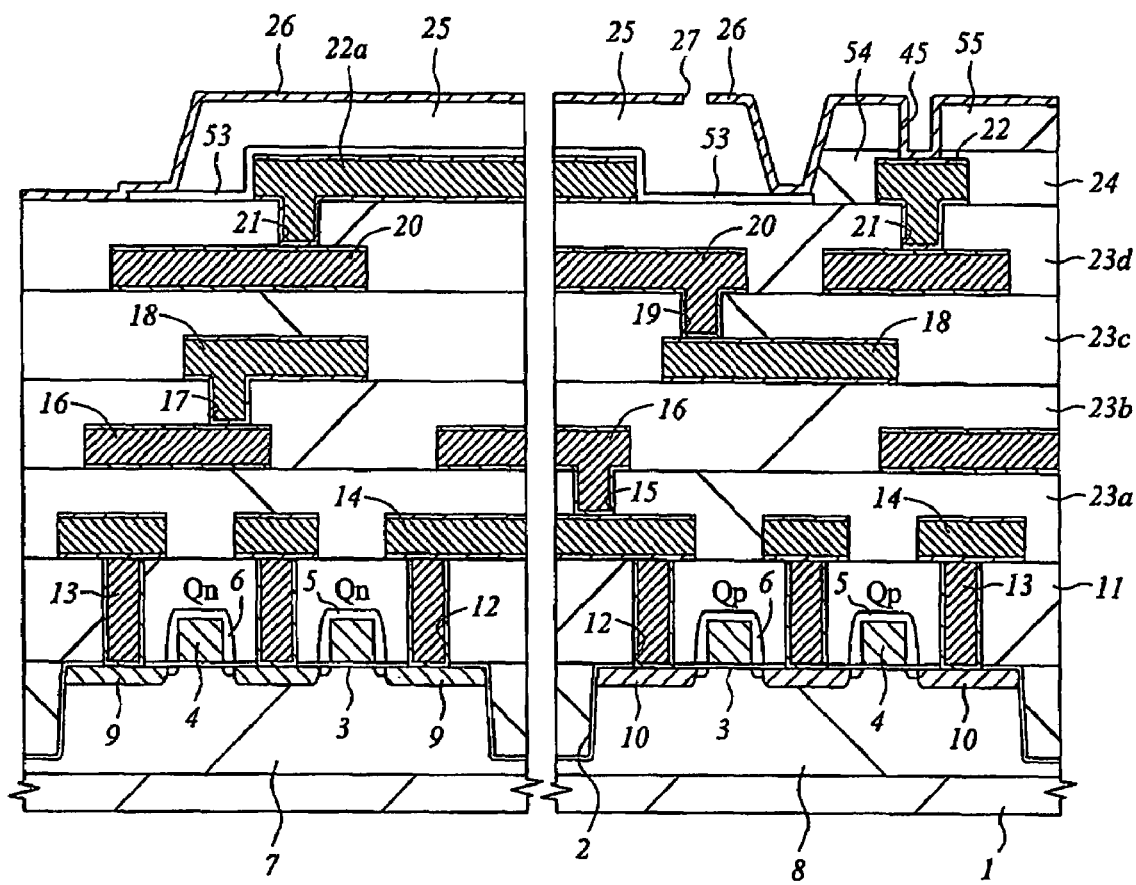
FIG. 36 is a section view showing the method of manufacturing a semiconductor device embedded with pressure sensor subsequent to FIG. 35.

Next, as shown in FIG. 36, the silicon oxide films 54 and 55 inside of the hole 27 are etched by using hydrofluoric acid. By doing so, the cavity 25 is formed between the lower electrode 22a and the tungsten silicide film 26. This etching is performed to removing all of the silicon oxide films 54 and 55 between the silicon nitride film 53 and the tungsten silicide film 26. Therefore, since no precise etching time control is required, the formation of the cavity 25 can be facilitated in comparison with the above-described first and second embodiments.

Figure 37:
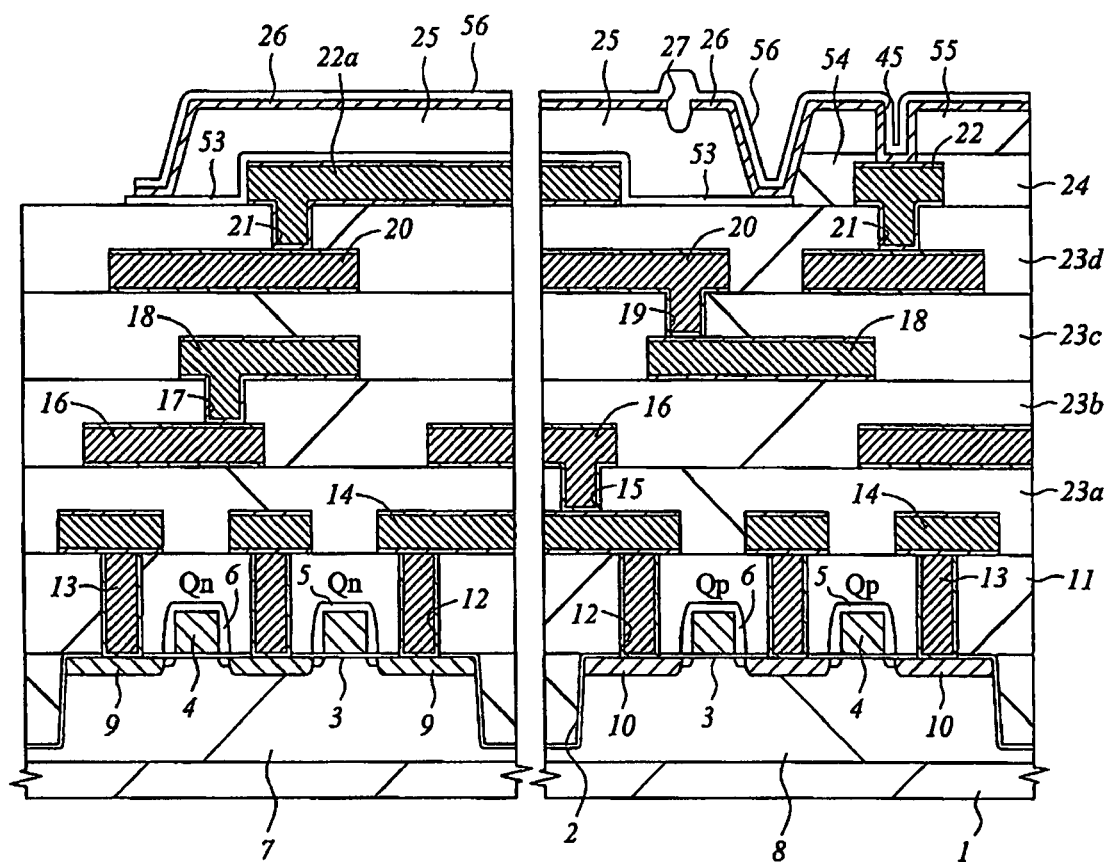
FIG. 37 is a section view showing the method of manufacturing a semiconductor device embedded with pressure sensor subsequent to FIG. 36.

Next, as shown in FIG. 37, after the hole 27 is filled by depositing a silicon oxide film 56 on the tungsten silicide film 26, the silicon oxide film 56 is etched so that the silicon oxide film 56 is left only inside and in the periphery of the hole 27. The subsequent processes are identical to those in the above-described first embodiment.

Many semiconductor devices embedded with pressure sensor according to this embodiment are manufactured, and their characteristics are measured. As a result, variation in capacitance value under atmospheric pressure is smaller than that in the above-described first and second embodiments. This is because, unlike the first and second embodiments, the volume of the cavity 25 can be made always constant without depending on the time of the etching by hydrofluoric acid. The other characteristics are similar to those in the above-described first embodiment.

Fourth Embodiment

In the fourth embodiment, the present invention is applied to a semiconductor device embedded with pressure sensor in which a digital circuit, an analog circuit such as an amplifier for amplifying a sensor signal and a wireless transceiver circuit, an EEPROM circuit, a capacitive pressure sensor and the like are embedded together on one chip.

Figure 38:
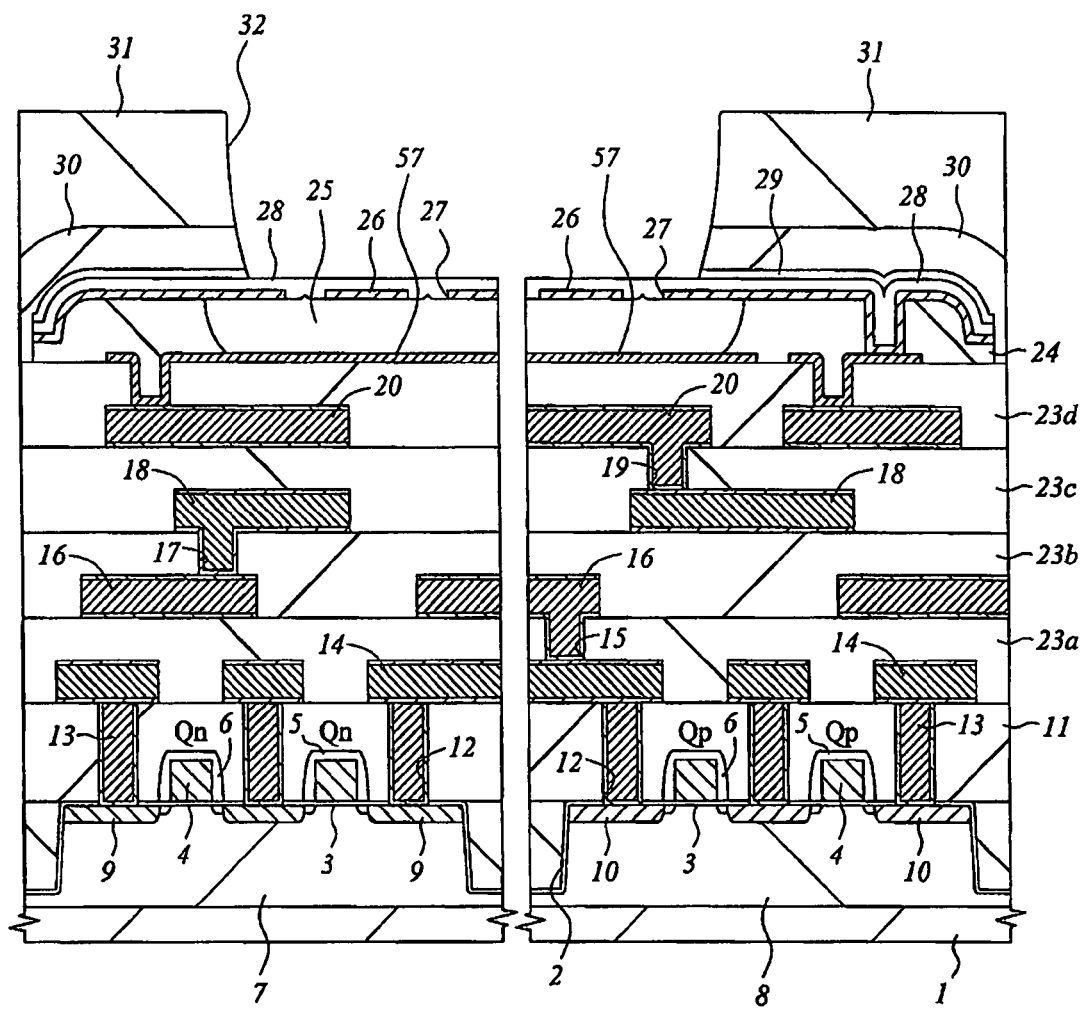
FIG. 38 is a section view of main components including a pressure detecting unit of a semiconductor device embedded with pressure sensor according to still another embodiment of the present invention.

FIG. 38 is a section view of a pressure detecting unit according to this embodiment. In this embodiment, the fourth layer wiring 20 is the uppermost layer wiring, and a lower electrode 57 is formed of a conductive layer upper than the uppermost layer wiring. The conductive layer forming the lower electrode 57 is formed of a tungsten film, an aluminum alloy film, or a copper film having a thickness of 100 nm deposited by, for example, a sputtering method.

In this embodiment, a conductive layer forming the lower electrode 57 is required in addition to the wirings. However, in comparison with the case in which the lower electrode 57 is formed of wiring layer, the lower electrode 57 can be formed to be thinner. Therefore, even if the insulating film of a layer upper than the lower electrode 57 is not planarized by the CMP, sufficient planarity can be obtained.

The cavity 25 is formed by etching the silicon oxide film 24 with hydrofluoric acid. Note that, if the silicon oxide film 24 is etched with hydrofluoric acid, the lower portion of the cavity 25 (lower electrode 57) and the upper portion thereof (tungsten silicide film 26) are stuck to each other in some cases. In such a case, for the prevention of the sticking, a polyimide resin film is used to form the insulating film between the lower electrode 57 and the tungsten silicide film 26 and the polyimide resin is etched by the oxygen plasma ashing.

Fifth Embodiment

Figure 39:
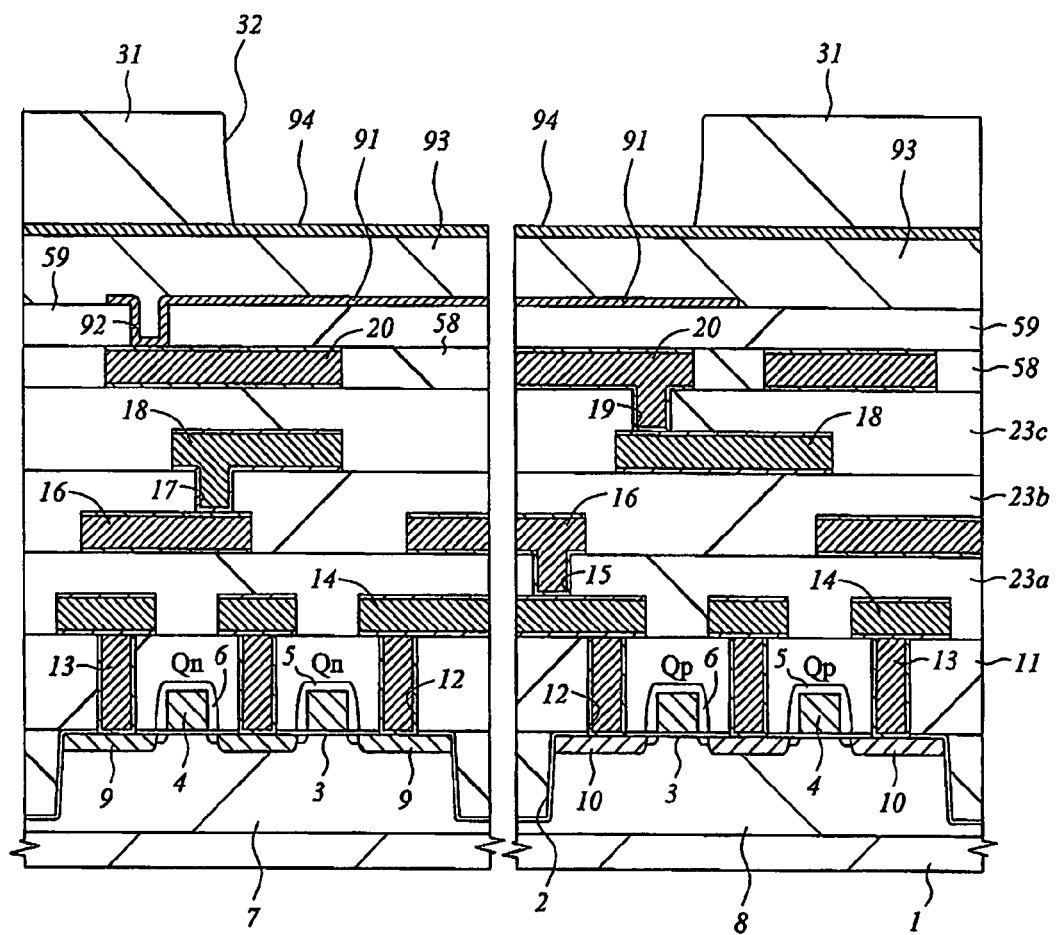
FIG. 39 is a section view of main components including a pressure detecting unit of a semiconductor device embedded with pressure sensor according to still another embodiment of the present invention.

FIG. 39 is a section view of a pressure detecting unit according to this embodiment. In this embodiment, the fourth layer wiring 20 is the uppermost layer wiring, and a planarized silicon oxide film 58 is formed on the upper portion thereof. A silicon nitride film 59 is formed on the upper portion of the silicon oxide film 58. Also, on the upper portion of the silicon nitride film 59, an electrode 91 formed of a conductive layer upper than the uppermost layer wiring is formed. The electrode 91 is formed of, for example, an aluminum alloy film and is connected to the fourth layer wiring 20 via a via hole 92.

On the upper portion of the electrode 91, a pressure-sensitive conductive film 93 having a thickness of 5 μm is formed. The pressure-sensitive conductive film 93 used in this embodiment is formed of a material in which conductive particles are distributed in a base material made of an organic material. In more detail, the base material is an elastomer, and the conductive particles are nickel, but other materials may be used. Even with a film in which carbon is used as the conductive particles, it is possible to manufacture a semiconductor device embedded with pressure sensor similar to that of this embodiment.

In this embodiment, the previously-cut pressure-sensitive conductive film 93 is bonded so as to cover the electrode 91. The cut pressure-sensitive conductive film 93 has one surface applied with an adhesive (not shown). With this adhesive, the film can be fixed onto the surface of the silicon substrate 1 when a protective sheet is peeled off. Since the adhesive is not present on a portion covering the electrode 91, no influence is exerted on electric connection between the electrode 91 and the pressure-sensitive conductive film 93. After the pressure-sensitive conductive film 93 is fixed to a predetermined position, an aluminum alloy film 94 is formed on the pressure-sensitive conductive film 93. Although it is possible to detect pressure even without this aluminum alloy film 94, owing to the presence of this film, it is possible to sensitively detect the changes in resistivity of the pressure-sensitive conductive film 93 by the deformation in a direction vertical to the main surface of the silicon substrate 1. That is, a highly-sensitive pressure sensor can be achieved. By embedding a pressure detecting unit including this aluminum alloy film 94 together with a pressure detecting unit not including this on the same semiconductor device embedded with pressure sensor, it becomes possible to detect a wide range of pressure. The aluminum alloy film 94 has the photosensitive polyimide film 31 formed thereon. Also, the photosensitive polyimide film 31 is removed from the upper portion of the pressure detecting unit to form the opening 32.

Figure 40:
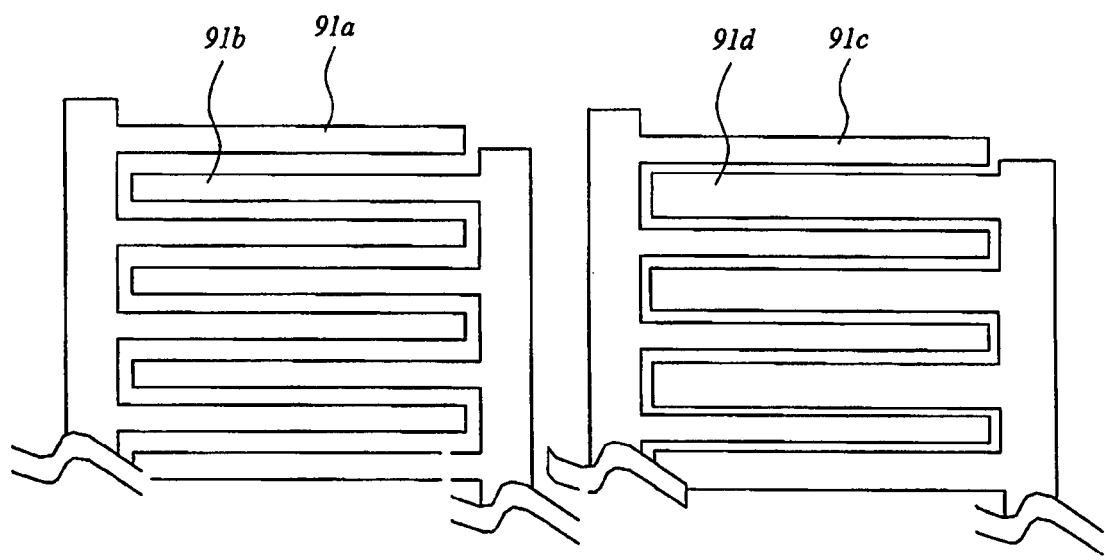
FIG. 40 is a plan view of an electrode layout of the semiconductor device embedded with pressure sensor shown in FIG. 39.

FIG. 40 shows one example of a plane layout of the above-mentioned electrode 91. By measuring the resistance between electrodes 91a and 91b (or between 91c and 91d) facing to each other, the pressure is obtained. In comparison with the distance between the electrodes 91a and 91b, the distance between the electrodes 91c and 91d is shorter. By measuring the changes in resistance between the electrodes 91a and 91b and the changes in resistance between the electrodes 91c and 91d in accordance with the pressure in advance and storing them in the memory unit, it becomes possible to measure the pressure in a wider range with high accuracy. Also, by obtaining the pressure from an average value or a central value measured from many disposed electrodes having exactly the same pattern, it becomes possible to measure the pressure without suffering from the influences of partial failures. Furthermore, in addition to the presence or absence of the aluminum alloy film 94 shown in FIG. 39 or the contrivance of the pattern of the electrodes (91a to 91d), two types of pressure-sensitive conductive films 93 having different thicknesses or materials can be used on the same semiconductor device embedded with pressure sensor. By doing so, it becomes possible to detect the pressure in a wider range with high accuracy. Note that, in the semiconductor device embedded with pressure sensor according to this embodiment, temperature is obtained from the above-described temperature sensor to correct the pressure based on the temperature.

Many semiconductor devices embedded with pressure sensor according to this embodiment are manufactured, and their characteristics are measured. As a result of the measurement, it is possible to measure the pressure with a high degree of reproducibility within a range of 7 kg/cm$^2$ from the atmospheric pressure. Also, the device is excellent in durability.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a semiconductor device embedded with pressure sensor.

What is claimed is:

1. A semiconductor device, comprising:
   an electronic circuit having MOS transistors formed on a semiconductor substrate and multilevel wiring layers formed over said semiconductor substrate, and
   a sensor having a fixed electrode, a diaphragm formed over said fixed electrode and a cavity formed between said fixed electrode and said diaphragm,
   wherein said fixed electrode of said sensor is formed by using one of said multilevel wiring layers of said electronic circuit, and
   wherein said diaphragm of said sensor is formed by using a conductive layer upper than said one of said multilevel wiring layers.

2. The semiconductor device according to claim 1, wherein said electronic circuit comprises a digital circuit and an analog circuit, and
   wherein said sensor is formed above a formation area of said digital circuit.

3. The semiconductor device according to claim 2, wherein said sensor is not formed above a formation area of said analog circuit.

4. The semiconductor device according to claim 1, wherein said sensor detects pressure by measuring a capacitance between said fixed electrode and said diaphragm.

5. The semiconductor device according to claim 1, wherein said device is installed in a tire and is used for detecting pressure inside said tire.

6. The semiconductor device according to claim 1, wherein said diaphragm comprises a tungsten silicide film or a tungsten film.

7. The semiconductor device according to claim 6, wherein said tungsten silicide film or said tungsten film has a tensile stress.

8. The semiconductor device according to claim 1, wherein the sensor is a pressure sensor.

9. The semiconductor device according to claim 1, wherein the sensor is a capacitive pressure sensor.

* * * * *

UNITED STATES PATENT AND TRADEMARK OFFICE
CERTIFICATE OF CORRECTION

PATENT NO.        : 7,451,656 B2                                              Page 1 of 1
APPLICATION NO.   : 11/878243
DATED             : November 18, 2008
INVENTOR(S)       : Yokoyama et al.

It is certified that error appears in the above-identified patent and that said Letters Patent is hereby corrected as shown below:

On the face of the patent, Under Item (73) and under (*) Notice: After the existing language

Please insert -- This patent is subject to any Terminal Disclaimer of U.S. Patent No. 7,270,012. --

Signed and Sealed this

Seventeenth Day of February, 2009

JOHN DOLL
*Acting Director of the United States Patent and Trademark Office*